(12) United States Patent
Kang et al.

(10) Patent No.: US 7,071,547 B2
(45) Date of Patent: Jul. 4, 2006

(54) ASSEMBLIES HAVING STACKED SEMICONDUCTOR CHIPS AND METHODS OF MAKING SAME

(75) Inventors: Teck-Gyu Kang, San Jose, CA (US); Yoichi Kubota, Pleasanton, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/655,952

(22) Filed: Sep. 5, 2003

(65) Prior Publication Data

US 2004/0099938 A1    May 27, 2004

Related U.S. Application Data

(60) Provisional application No. 60/409,880, filed on Sep. 11, 2002.

(51) Int. Cl.
*H01L 23/02* (2006.01)

(52) U.S. Cl. ..................... 257/686; 257/777

(58) Field of Classification Search ............. 257/686, 257/777, 723, 724
See application file for complete search history.

(56) References Cited

U.S. PATENT DOCUMENTS

| | | | |
|---|---|---|---|
| 3,390,308 A | 6/1968 | Marley | |
| 3,923,359 A | 12/1975 | Newsam | |
| 4,371,744 A | 2/1983 | Badet et al. | |
| 4,371,912 A | 2/1983 | Guzik | |
| 4,489,364 A | 12/1984 | Chance | |
| 4,540,226 A | 9/1985 | Thompson et al. | |
| 4,551,746 A | 11/1985 | Gilbert et al. | |
| 4,558,397 A | 12/1985 | Olsson | |
| 4,638,348 A | 1/1987 | Brown et al. | |
| 4,734,825 A | 3/1988 | Peterson | |
| 4,754,316 A | 6/1988 | Reid | |
| 4,761,681 A | 8/1988 | Reid | |
| 4,841,355 A | 6/1989 | Parks | |
| 4,868,712 A | 9/1989 | Woodman | |
| 4,897,918 A | 2/1990 | Osaka et al. | |
| 4,941,033 A | 7/1990 | Kishida | |
| 4,956,694 A | 9/1990 | Eide | |
| 4,982,265 A | 1/1991 | Watanabe et al. | |
| 4,994,902 A | 2/1991 | Okahashi et al. | |
| 4,996,583 A | 2/1991 | Hatada | |

(Continued)

FOREIGN PATENT DOCUMENTS

JP    52-075981    6/1977

(Continued)

OTHER PUBLICATIONS

Bang, et al., U.S. Appl. No. 60/403,939, filed Aug. 16, 2002.

(Continued)

*Primary Examiner*—S. V. Clark
(74) *Attorney, Agent, or Firm*—Lerner, David, Littenberg, Krumholz & Mentlik, LLP

(57) ABSTRACT

A stacked microelectronic assembly comprises a continuous sheet including a core panel and a plurality of side panels, each having a folded portion that connects the side panel to an edge of the core panel. At least two of the panels are at least partially horizontally aligned with one another in a stack. During manufacture of a stacked microelectronic assembly, failed microelectronic elements are identified and associated side panels thereof are simply cut-off. This results in the production of a usable stacked microelectronic assembly albeit of reduced capacity, or reduced functionality.

17 Claims, 29 Drawing Sheets

U.S. PATENT DOCUMENTS

| | | | |
|---|---|---|---|
| 4,996,587 A | 2/1991 | Hinrichsmeyer et al. | |
| 5,008,496 A | 4/1991 | Schmidt et al. | |
| 5,028,986 A | 7/1991 | Sugano et al. | |
| 5,045,921 A | 9/1991 | Lin et al. | |
| 5,117,282 A * | 5/1992 | Salatino | 257/686 |
| 5,128,831 A | 7/1992 | Fox, III et al. | |
| 5,138,438 A | 8/1992 | Masayuki et al. | |
| 5,148,265 A | 9/1992 | Khandros et al. | |
| 5,148,266 A | 9/1992 | Khandros et al. | |
| 5,172,303 A | 12/1992 | Bernardoni et al. | |
| 5,198,888 A | 3/1993 | Sugano et al. | |
| 5,222,014 A | 6/1993 | Lin | |
| 5,247,423 A | 9/1993 | Lin et al. | |
| 5,266,912 A | 11/1993 | Kledzik | |
| 5,281,852 A | 1/1994 | Normington | |
| 5,311,401 A | 5/1994 | Gates, Jr. et al. | |
| 5,313,096 A | 5/1994 | Eide | |
| 5,334,875 A | 8/1994 | Sugano et al. | |
| 5,337,077 A | 8/1994 | Browne | |
| 5,347,159 A | 9/1994 | Khandros et al. | |
| 5,376,825 A | 12/1994 | Tukamoto et al. | |
| 5,384,689 A | 1/1995 | Shen | |
| 5,397,916 A | 3/1995 | Normington | |
| 5,412,247 A | 5/1995 | Martin | |
| 5,448,511 A | 9/1995 | Paurus et al. | |
| 5,455,740 A | 10/1995 | Burns | |
| 5,479,318 A | 12/1995 | Burns | |
| 5,489,749 A | 2/1996 | DiStefano et al. | |
| 5,518,964 A | 5/1996 | DiStefano et al. | |
| 5,543,664 A | 8/1996 | Burns | |
| 5,548,091 A | 8/1996 | DiStefano et al. | |
| 5,552,631 A | 9/1996 | McCormick | |
| 5,552,963 A | 9/1996 | Burns | |
| 5,600,541 A | 2/1997 | Bone et al. | |
| 5,608,265 A | 3/1997 | Kitano et al. | |
| 5,616,958 A | 4/1997 | Laine et al. | |
| 5,625,221 A | 4/1997 | Kim et al. | |
| 5,637,536 A | 6/1997 | Val | |
| 5,639,695 A | 6/1997 | Jones et al. | |
| 5,642,261 A | 6/1997 | Bond et al. | |
| 5,656,856 A | 8/1997 | Kweon | |
| 5,659,952 A | 8/1997 | Kovac et al. | |
| 5,668,405 A | 9/1997 | Yamashita | |
| 5,677,566 A | 10/1997 | King et al. | |
| 5,679,977 A | 10/1997 | Khandros et al. | |
| 5,681,777 A | 10/1997 | Lynch et al. | |
| 5,701,031 A | 12/1997 | Oguchi et al. | |
| 5,734,555 A | 3/1998 | McMahon | |
| 5,751,063 A | 5/1998 | Baba | |
| 5,776,797 A | 7/1998 | Nicewarner, Jr. et al. | |
| 5,783,870 A | 7/1998 | Mostafazadeh et al. | |
| 5,784,264 A | 7/1998 | Tanioka | |
| 5,789,815 A | 8/1998 | Tessier et al. | |
| 5,801,439 A | 9/1998 | Fujisawa et al. | |
| 5,804,874 A | 9/1998 | An et al. | |
| 5,805,422 A | 9/1998 | Otake et al. | |
| 5,834,339 A | 11/1998 | Distefano et al. | |
| 5,835,988 A | 11/1998 | Ishii | |
| 5,844,315 A | 12/1998 | Melton et al. | |
| 5,861,666 A | 1/1999 | Bellaar | |
| 5,883,426 A | 3/1999 | Tokuno et al. | |
| 5,956,234 A | 9/1999 | Mueller | |
| 5,977,618 A | 11/1999 | DiStefano et al. | |
| 6,030,856 A | 2/2000 | DiStefano et al. | |
| 6,054,756 A | 4/2000 | DiStefano et al. | |
| 6,072,233 A | 6/2000 | Corisis et al. | |
| 6,093,029 A | 7/2000 | Kwon et al. | |
| 6,121,676 A | 9/2000 | Solberg | |
| 6,172,418 B1 | 1/2001 | Iwase | |
| 6,180,881 B1 | 1/2001 | Isaak | |
| 6,195,268 B1 | 2/2001 | Eide | |
| 6,208,521 B1 | 3/2001 | Nakatsuka | |
| 6,218,848 B1 | 4/2001 | Hembree et al. | |
| 6,225,688 B1 * | 5/2001 | Kim et al. | 257/686 |
| 6,232,152 B1 | 5/2001 | DiStefano et al. | |
| 6,239,384 B1 | 5/2001 | Smith et al. | |
| 6,268,649 B1 | 7/2001 | Corisis et al. | |
| 6,291,259 B1 | 9/2001 | Chun | |
| 6,303,997 B1 | 10/2001 | Lee | |
| 6,313,522 B1 | 11/2001 | Akram et al. | |
| 6,335,565 B1 | 1/2002 | Miyamoto et al. | |
| 6,342,728 B1 | 1/2002 | Miyazaki et al. | |
| 6,351,029 B1 | 2/2002 | Isaak | |
| 6,369,445 B1 | 4/2002 | Khoury | |
| 6,388,264 B1 | 5/2002 | Pace | |
| 6,462,412 B1 * | 10/2002 | Kamei et al. | 257/723 |
| 6,462,421 B1 | 10/2002 | Hsu et al. | |
| 6,469,377 B1 | 10/2002 | Kondo | |
| 6,469,903 B1 | 10/2002 | Kondo | |
| 6,496,026 B1 | 12/2002 | Long et al. | |
| 6,515,870 B1 | 2/2003 | Skinner et al. | |
| 6,646,335 B1 | 11/2003 | Emoto | |
| 6,677,670 B1 | 1/2004 | Kondo | |
| 6,717,250 B1 * | 4/2004 | Emoto | 257/686 |
| 6,762,942 B1 * | 7/2004 | Smith | 361/749 |
| 6,831,835 B1 * | 12/2004 | Soto | 361/704 |
| 6,841,855 B1 * | 1/2005 | Jaeck et al. | 257/668 |
| 6,879,032 B1 * | 4/2005 | Rosenau et al. | 257/696 |
| 6,892,825 B1 * | 5/2005 | Hopson | 172/824 |
| 2001/0006252 A1 | 7/2001 | Kim et al. | |

FOREIGN PATENT DOCUMENTS

| | | |
|---|---|---|
| JP | 56-61151 | 5/1981 |
| JP | 57-31166 A1 | 2/1982 |
| JP | 58-178529 | 10/1983 |
| JP | 60-194548 | 3/1984 |
| JP | 61-029140 | 2/1986 |
| JP | 61-101067 | 5/1986 |
| JP | 61-120454 | 6/1986 |
| JP | 61-137335 | 6/1986 |
| JP | 61-255046 | 11/1986 |
| JP | 63-18654 | 1/1988 |
| JP | 62-226307 | 3/1989 |
| JP | 64-71162 | 3/1989 |
| JP | 199859 A | 8/1990 |
| WO | WO-03/019654 | 3/2003 |

OTHER PUBLICATIONS

Kim et al., U.S. Appl. No. 09/776,356, filed Feb. 2, 2001.

"Megabyte Per Cubic Inch," Defense Science, May 1988, p. 56.

"Three-Dimensional Packaging," Defense Science, May 1988, p. 65.

Bang, U.S. Appl. No. 10/656,534, filed Sep. 5, 2003.

Forthun, U.S. Appl. No. 07/552,578, filed Jul. 13, 1990.

Mohammed, U.S. Appl. No. PCT/US02/26805, filed Aug. 22, 2002.

Newsam, U.S. Appl. No. 60/314,042, filed Aug. 22, 2001.

U.S. Appl. No. 07/552,578, filed Jul. 13, 1990, Forthun.

* cited by examiner

FIG. 26

| Usable Packages | Memory Capacity | | Failures |
| --- | --- | --- | --- |
| | Flash Capacity | SRAM Capacity | |
| chip assembly 450 | 32 Mbytes | 2 Mbytes | No failures |
| chip assembly 450-1 | 16 Mbytes | 2 Mbytes | one Flash memory |
| chip assembly 450-2 | 32 Mbytes | 1 Mbytes | one SRAM memory |
| chip assembly 450-3 | 16 Mbytes | 1 Mbytes | one Flash and one SRAM |

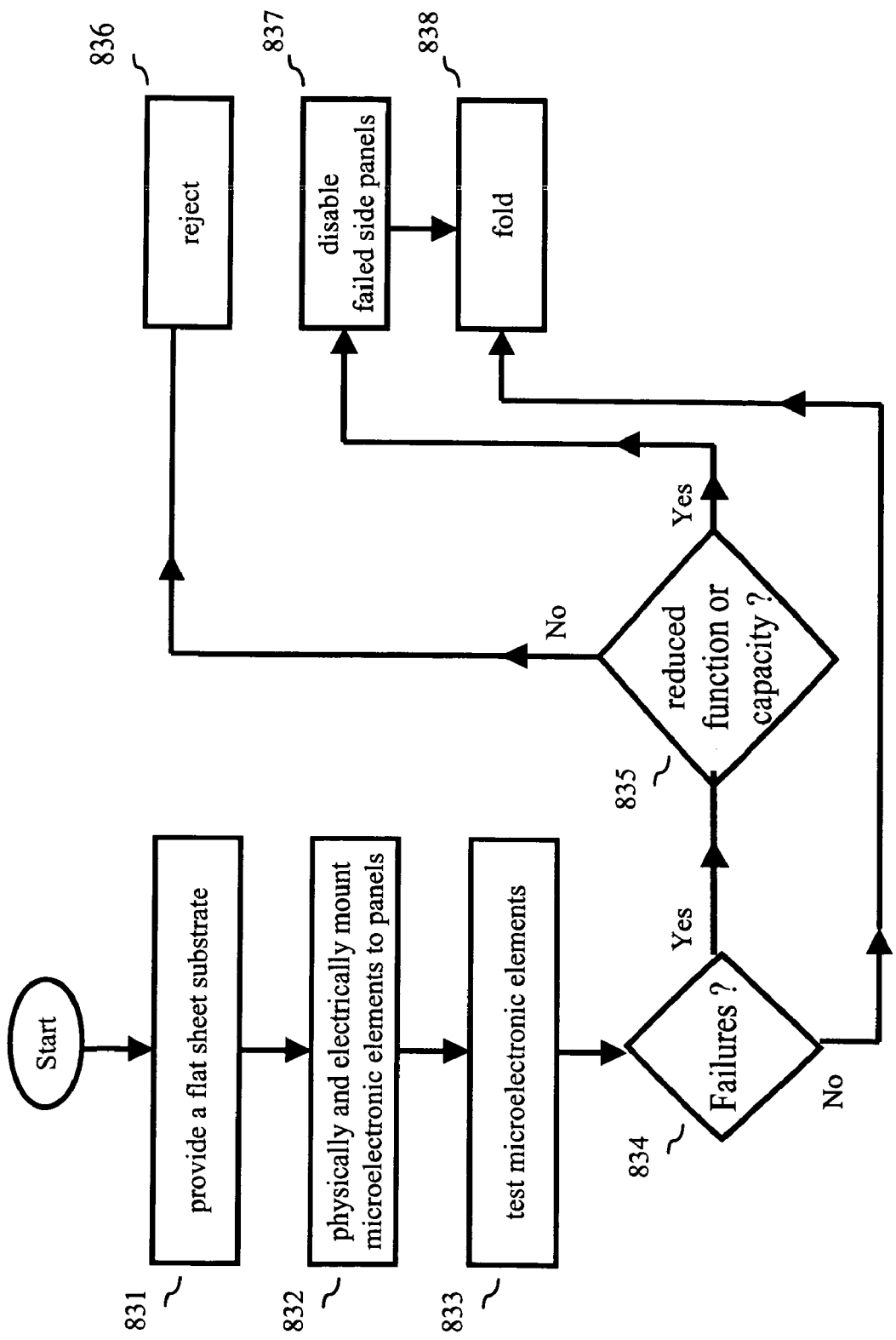

ASSEMBLIES HAVING STACKED SEMICONDUCTOR CHIPS AND METHODS OF MAKING SAME

CROSS-REFERENCE TO RELATED APPLICATION

This application claims the benefit of U.S. Provisional Patent Application Ser. No. 60/409,880, filed Sep. 11, 2002, the disclosure of which is hereby incorporated by reference herein.

BACKGROUND OF THE INVENTION

The present invention relates to stacked microelectronic assemblies and methods of making such assemblies, to methods of forming such assemblies and to components useful in such assemblies.

Semiconductor chips are commonly provided as individual, prepackaged units. A standard chip has a flat, rectangular body with a large front face having contacts connected to the internal circuitry of the chip. Each individual chip is mounted in a package, which in turn is mounted on a circuit panel, such as a printed circuit board, and which connects the contacts of the chip to conductors on the circuit panel. In many conventional designs, the chip package occupies an area of the circuit panel considerably larger than the area of the chip itself. As used in this disclosure, with reference to a flat chip having a front face, the "area of the chip" should be understood as referring to the area of the front face. In "flip-chip" designs, the front face of the chip confronts the face of the circuit panel, and the contacts on the chip are bonded directly to the circuit panel by solder balls or other connecting elements. The "flip-chip" design provides a relatively compact planar arrangement; each chip occupies an area of the circuit panel equal to or slightly larger than the area of the chip front face. However, this approach suffers from cost and reliability problems. As disclosed, for example, in certain embodiments of commonly assigned U.S. Pat. Nos. 5,148,265; 5,148,266; and 5,679,977, the disclosures of which are incorporated herein by reference, certain innovative mounting techniques offer compactness approaching or equal to that of conventional flip-chip bonding without the reliability and testing problems commonly encountered in that approach. A package which can accommodate a single chip in an area of the circuit panel equal to or slightly larger than the area of the chip itself is commonly referred to as a "chip-size package."

Various proposals have been advanced for providing multiple chips in a single package or module. In a conventional "multi-chip module," the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module. It has also been proposed to package multiple chips in a "stacked" arrangement, i.e., an arrangement where chips are placed one on top of another. In a stacked arrangement, several chips can be mounted in an area of the circuit panel that is less than the total area of the chips. Certain stacked chip arrangements are disclosed, for example, in certain embodiments of the aforementioned '977 and '265 patents and in U.S. Pat. No. 5,347,159, the disclosure of which is incorporated herein by reference. U.S. Pat. No. 4,941,033, also incorporated herein by reference, discloses an arrangement in which chips are stacked one on top of another and interconnected with one another by conductors on so-called "wiring films" associated with the chips.

Another approach is presented in commonly assigned U.S. Pat. Nos. 6,121,676 and 6,225,688 and U.S. patent application Ser. No. 09/776,356 filed Feb. 2, 2001, the disclosures of which are incorporated herein by reference. Certain preferred embodiments of the stacked microelectronic assemblies disclosed in these patents and application include an elongated, tape-like flexible substrate having terminals for connection to an external circuit and having a plurality of chips distributed along the axis of elongation of the substrate and attached thereto. The flexible substrate is folded so as to stack the chips in substantially vertical alignment with one another. While assemblies according to these embodiments provide useful improvements, still further improvements would be desirable. In these assemblies, the individual chips are connected to the terminals and to each other by traces extending generally lengthwise along the elongated substrate. The lengths of the traces connecting the various chips to the terminals may differ from one another. Thus, the chip furthest from the terminals along the length of the substrate is connected to the terminals by relatively long traces, whereas the chip closest to the terminals is connected to the terminals by shorter traces. As the delay in signal propagation along the traces varies with the length of the traces, such delays increase as the number of chips distributed along the axis of the flexible substrate is increased.

Certain preferred embodiments of U.S. Pat. No. 5,861,666, the disclosure of which is incorporated herein by reference, disclose an assembly of plural chip-bearing units vertically stacked one atop another. Each unit includes a small panel or "interposer" and a semiconductor chip mounted thereto. The units are stacked so that the chips overlie one another and are electrically interconnected with one another, for example, by solder balls connecting conductive features of adjacent interposers to one another. Assemblies of this type provide rapid signal propagation to all of the chips in the stack. However, the number of electrical interconnections increases as the number of chips in the stack is increased.

Thus, still further improvements in stacked chip assemblies would be desirable.

Indeed, a growing number of portable devices, such as cellular phones and personal digital assistants (PDAs), are becoming more and more "PC-like." These portable devices have a microprocessor and memory for storage of programs and data, are typically small in size, and have low power requirements. As such, the above-mentioned stacked chip assembly is a useful integrated circuit (IC) package for use in such an environment since a stacked chip assembly can incorporate a number of functions in a small footprint with low power dissipation. For example, a folded stack package may incorporate a microprocessor device and one or more memory devices (e.g., static random access memory (SRAM) and lash memory).

Unfortunately, in manufacturing a multiple die package, such as a folded stack package, the package yield from a manufacturing "burn-in" test may be low. For example, if just one of the devices in a folded stack package fails during the burn-in test—either the entire folded stack package is scraped or must be re-worked, i.e., any devices that fail are replaced. However, such identification and replacement of failed devices adds time and labor to the burn-in process.

Thus, still further improvements in testing of stacked chip assemblies would also be desirable.

SUMMARY OF THE INVENTION

One aspect of the present invention provides a stacked microelectronic assembly wherein the microelectronic elements of the assembly are attached to a single continuous sheet that is folded, wherein at least two of the microelectronic elements, associated with different folds, are positioned on substantially the same plane, e.g., a horizontal plane, such that a side face of one of the microelectronic components faces a side face of the other microelectronic component. The sheet comprises a core panel and at least a plurality of flaps, or side panels, each of which has a folded portion that connects the side panel to an edge of the core panel. At least two of the side panels of the assembly, when folded, are at least partially aligned on substantially the same plane with one another, wherein the plane is substantially parallel to the core panel. In other words, at least two of the side panels, when folded, are on the same side of the core panel and substantially the same distance away from a surface of the core panel. Preferably, the sheet further comprises terminals on one of its surfaces and a wiring layer having traces extending along the sheet between the panels by way of the folded portions. Microelectronic elements are mounted on at least two of the panels and are electrically connected to the terminals through the traces. In certain preferred embodiments, according to this aspect of the invention, the core panel is disposed at the top or bottom of the stack with the terminals disposed on the core panel and exposed for connection to an external circuit. In certain, more preferred embodiments, the core panel is generally rectangular, having at least first and second edges, and the plurality of side panels includes at least first and second side panels extending from the respective edges. Each side panel has at least one microelectronic element attached thereto and a set of traces extending from the side panel to the terminals of the core panel. Preferably, at least two sets of traces for the two side panels of the stack aligned substantially in the same plane are substantially equal in length, providing substantially equal impedances and signal delays between the microelectronic elements and the terminals of the core panel. The microelectronic elements may comprise two or more substantially identical elements, as, for example, memory chips.

In accordance with another aspect of the invention, at least two of the side panels of the assembly, when folded, are at least partially aligned with one another in substantially the same plane, e.g., the horizontal plane, in a stack and connected to the core panel along edges that are parallel to one another. In certain, more preferred embodiments, the core panel is generally rectangular, having first, second, third and fourth edges, and the plurality of side panels includes first, second, third and fourth side panels extending from the respective edges. At least two of these side panels are at least partially aligned with one another in substantially the same plane in a stack. Each side panel has at least one microelectronic element attached thereto and a set of traces extending from the side panel to the terminals of the core panel. Preferably, are least twos sets of traces for two of the side panels are substantially equal in length, providing substantially equal impedances and signal delays between the microelectronic elements and the terminals of the core panel. The microelectronic elements may comprise two or more substantially identical elements, as, for example, memory chips.

In another preferred embodiment of this present aspect of the invention, the microelectronic elements comprise semiconductor chips. A core panel chip is mounted to the core panel and connected to terminals disposed on the core panel and to traces extending to the side panels. Chips mounted on the side panels are connected to the core panel chip through the traces. Preferably, the terminals on the core panel are movable with respect to the core panel chip to relieve mechanical stresses caused by differential thermal expansion of the circuit board and chips during bonding and operation of the stacked assembly. In certain applications of this embodiment of the invention, the core panel is a processor chip, and side panel chips are memory chips. In other embodiments of the invention, one of the side panels is disposed at the top or bottom of the stack rather than having the core panel disposed in such a position, with terminals disposed on the side panel and exposed for connection to an external circuit.

Another aspect of the invention can increase the yield of stacked chip assemblies during manufacture. In particular, while portable devices may have differing processor and memory requirements—these requirements may overlap or be subsets of one another. For example, a first type of portable device may require a processor with a memory capacity of two 16 Mbyte (millions of bytes) SRAMs and two 1 Mbyte flash memories. This stacked arrangement illustratively comprises a core panel for the processor and four side panels for the memories. However, a second type of portable device may only require the processor and a memory capacity of one 16 Mbyte SRAM and one 1 Mbyte flash memory. As such, and in accordance with an aspect of the invention, if during manufacture of the four side panel folded stack—one SRAM and one flash fail—these side panels may simply be disabled, e.g., "cut-off," to provide a core panel with a processor and two side panels—one with a 16 Mbyte SRAM and one with a 1 Mbyte flash memory—which is of use in the second portable device. Thus, even if failures are detected during assembly of a folded stack—the panels holding the failed components can be simply removed such that the folded stack is still capable of use. The removal of one or more panels can be performed quicker and with less cost than replacement of the failed microelectronic elements and subsequent re-testing thereof.

In accordance with another aspect of the invention, a folded stack assembly has an associated capacity or functionality. The capacity, or functionality, can relate to memory size, processor speed, etc. During manufacture of the folded stack assembly, those side panels associated with failed microelectronic components are cut-off. Thus, notwithstanding the failure, a usable stacked microelectronic assembly—albeit of reduced functionality, or capacity—is still produced without requiring replacement or re-testing of the failed microelectronic elements.

Another aspect of the invention relates to methods of making stacked electronic assemblies of the types described herein using a substrate in the form of a flat sheet. The sheet comprises a core panel having edges and a plurality of side panels projecting from the edges of the core panel. The sheet further comprises electrically conductive terminals accessible at one of the surfaces of the sheet, and a wiring layer comprising traces extending along the sheet from the core panel to the side panels and being electrically connected to the terminals. The steps of making the stacked electronic assembly include providing a substrate in the form of a flat sheet as described herein, assembling a plurality of microelectronic elements to the panels, electrically connecting the microelectronic elements to the traces, testing the microelectronic elements attached to the flat sheet, identifying failed side panels, i.e., those side panels that include microelectronic elements that fail the testing, disabling the failed side panels, and folding portions of the remaining side panels about a plurality of fold axes adjacent to the edges of the core panel in such a way that at least some of the microelectronic elements are stacked in substantially vertical alignment with one another. In certain preferred methods according to this aspect of the invention, the terminals are disposed on the core panel or on one of the side panels and the folding is performed so that the terminals are exposed for connection to an external circuit.

BRIEF DESCRIPTION OF THE DRAWINGS

FIG. 26 shows an illustrative table for use in manufacturing stacked assemblies in accordance with the principles of the invention;

FIG. 29 shows an illustrative flow chart for manufacturing stacked assemblies in accordance with the principles of the invention.

DETAILED DESCRIPTION

Figure 1:
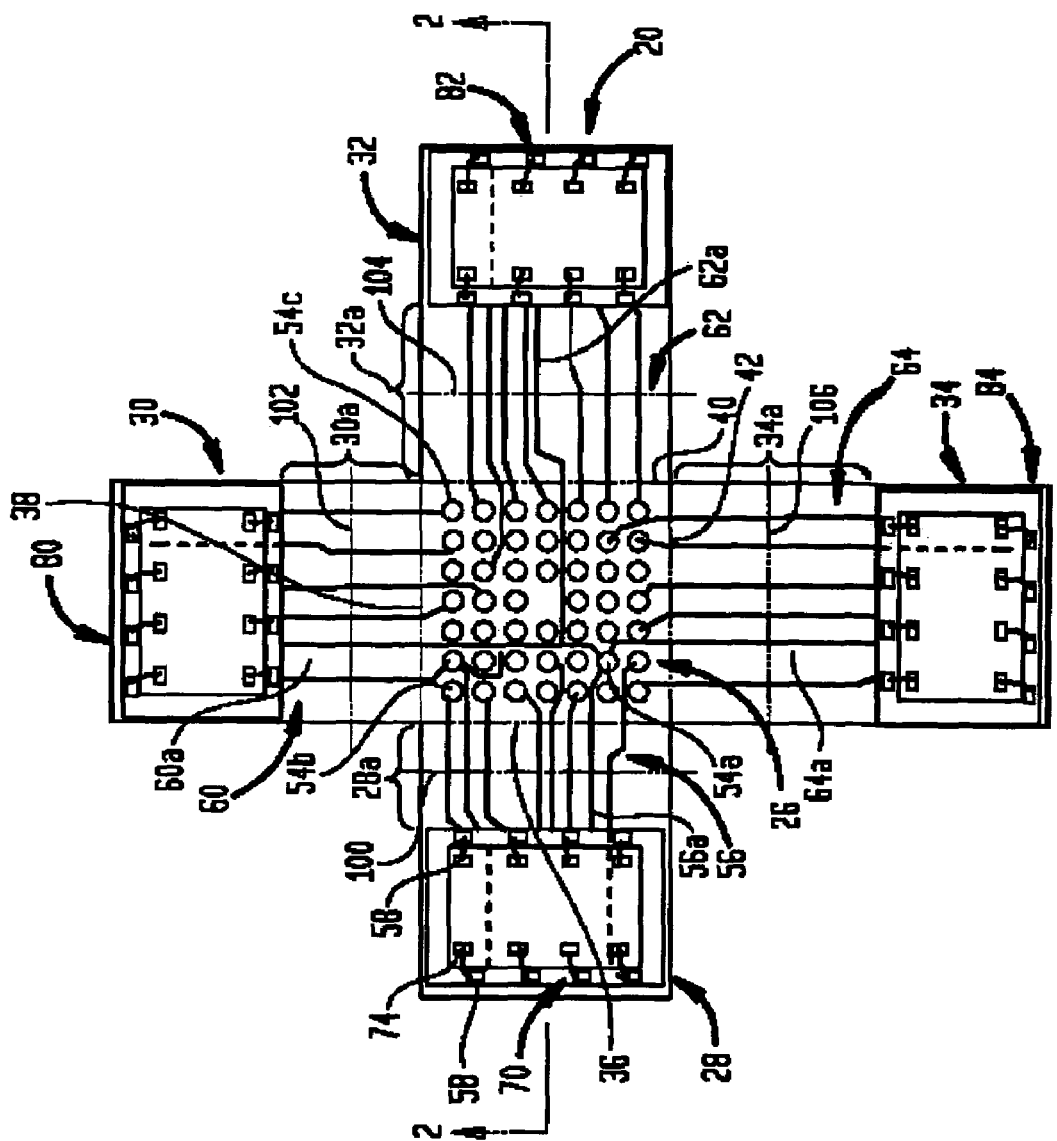
FIG. 1 is a diagrammatic plan view of a component according to one embodiment of the present invention.
Figure 2:
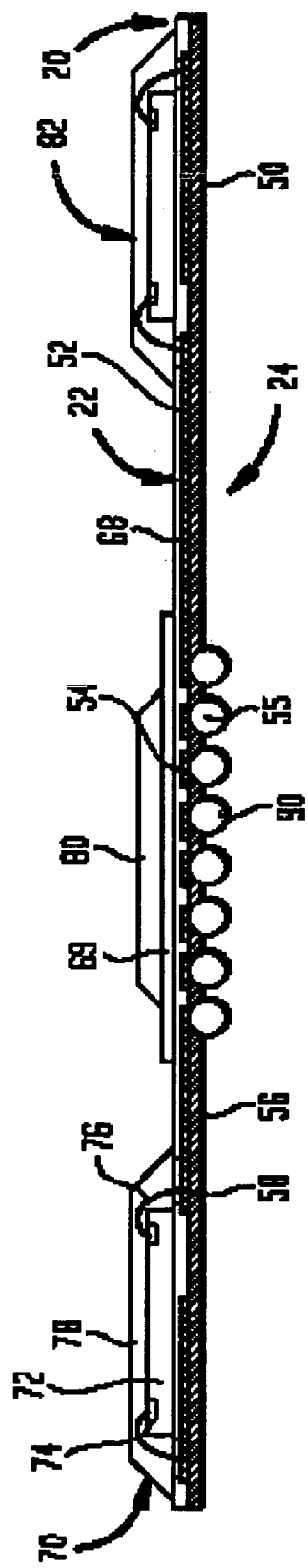
FIG. 2 is a diagrammatic sectional view taken along line 2—2 in FIG. 1.

An assembly in accordance with one embodiment of the invention includes a component in the form of a unitary sheet 20. The sheet has a first or obverse side 22 (the side visible in FIG. 1) and oppositely-directed reverse side 24 (FIG. 2). The sheet is of generally cruciform shape as seen in plan view, and includes a square core panel 26 having edges 36, 38, 40 and 42. The unitary sheet further includes four side panels 28, 30, 32 and 34 projecting from the core panel at the four edges 36–42. The first side panel 28 includes a fold region 28a adjacent the first edge 36 of the core panel. Similarly, the second side panel 30 includes a fold region 30a adjacent edge 38 of the core panel, whereas the third side panel has a fold region 32a adjacent edge 40 of the core panel and the fourth side panel includes a fold region 34a adjacent the fourth edge 42 of the core panel. As described herein, the "length" of each side panel and fold region refers to the dimension of the side panel or fold region perpendicular to the associated edge of the core panel. For example, the length of the first side panel 28 and the length of the first fold region 28a are the dimensions of these features perpendicular to the associated edge 36 of the core panel 26. Likewise, the length of second side panel 30 and length of its fold region 30a are the dimensions of these features perpendicular to the second edge 38 of the core panel.

The first fold region 28a is slightly shorter than the second fold region 30a, which in turn is slightly shorter than the third fold region 32, and fourth fold region 34a is, in turn, slightly longer than third fold region 32a. This difference in length is greatly exaggerated in FIG. 1 for clarity of illustration. Typically, each fold region is only a few tenths of a millimeter or a few millimeters shorter than the next longer fold region. The purpose of this difference in length is discussed below.

The sheet includes a layer of a dielectric 50 with a metallization layer 52 (FIG. 2) disposed on the obverse side of layer 50. The metallization layer 52 defines terminals 54 on core panel 26 and traces extending from the terminals outwardly along the fold region of each side panel to a chip mounting site adjacent the outboard end of the side panel. For example, a first set of traces 56 extends from at least some of the terminals 54 outwardly across the first edge 36 of the core panel and along the fold region 28a of the first side panel 28 to bond pads 58 disposed at a chip mounting site near the outboard end of the first panel, remote from the core panel. Similarly, a second set of traces 60 extends from the core panel from at least some of terminals 54 to bond pads at a site adjacent the outboard end of second side panel 30, whereas a third set of traces 62 extends on the third side panel 32 and a fourth set of traces 64 extends on the fourth side panel 34. The sheet further includes a solder mask layer 68 overlying the metallization layer 52. The solder mask layer is provided with apertures at the bond pads 58 on the first side panel and at the corresponding bond pads on the other side panels so that the bond pads are exposed to the obverse side 22 of the sheet. A compliant layer as, for example, a layer of a gel, elastomer, foam or other deformable polymer (FIG. 2), overlies the core panel and overlies the terminals 54 on the obverse side of the sheet. Holes 55 are provided in dielectric layer 50 so that terminals 54 are exposed to the reverse side of the sheet.

The materials and fabrication techniques used to form sheet 20 may be similar to those used to form conventional flexible circuits and conventional flexible mounting tapes such as tape automated bonding ("TAB") tapes. For example, the dielectric layer may include a layer of a flexible but substantially inextensible polymer such as polyimide or BT resin between about 25 and about 100 microns thick, whereas the metallization layer 52 constituting the terminals 54 and the traces 56–64 may be formed from copper, gold or other metal typically between about 5 and about 25 microns thick. The metallization layer may be provided as a continuous layer, which is etched to form the terminals, traces and bond pads, or else may be provided by selective deposition processes such as selective plating. Other materials and processes of types suitable for manufacture of flexible circuits can be employed. Materials and processes used for forming flexible circuits are discussed in Fjelstad, *An Engineer's Guide To Flexible Circuit Technology*, Electrochemical Publications Ltd. (1997), the disclosure of which is hereby incorporated by reference herein.

A first microelectronic unit 70 in the form of an encapsulated semiconductor chip is mounted to the first side panel 28 at the bond site adjacent the outboard end of the side panel remote from the core panel so that the fold region 28a lies between the microelectronic element and the core panel. As best seen in FIG. 2, the microelectronic 70 includes a semiconductor chip 72 having a front face with contacts 74 connected to the internal electronic elements of the chip (not shown). The chip is mounted on the obverse side of sheet 20 with its front or contact-bearing face facing upwardly, away from the sheet. Contacts 74 are connected by wire bonds 76 to the bond pads 58 of the first side panel. A conventional die attach adhesive (not shown) may be used to secure the chip 72 to sheet 20. Also, although the chip 72 is depicted as overlying the solder mask layer 68 of the sheet, this is not essential; the solder mask layer may have an opening at the bond site so that the rear or downwardly-facing surface of the chip can be attached directly to the dielectric layer 50 by the die attach adhesive. An encapsulant 78 covers chip 72 and the associated wire bonds 76 and the bond pads 58.

The traces of the first set 56 on first side panel 28, in cooperation with the bond pads 58 and wire bonds 76 serve to connect at least some of the contacts 74 of the chip 72 mounted on the first side panel 28 with at least some of the terminals 54 on the core panel. Second, third and fourth microelectronic elements 80, 82 and 84 are mounted on the second, third and fourth side panels 30, 32 and 34, respectively, in the same manner as the first microelectronic element 70. Each such microelectronic element has at least some contacts connected through the set of traces on the associated side panel to at least some of the contacts 54 on the core panel. The particular layout of traces 56, 60, 62 and 64 depicted in FIG. 1 is merely for illustrative purposes. However, as shown in FIG. 1, one or more of the terminals 54a may be a common terminal, which is connected by traces in more than one set to more than one microelectronic element. For example, common terminal 54a is connected by trace 56a of the first set to one bond pad 58 and, hence, to one contact of the chip in microelectronic element 70. The same terminal 54a is also connected by a trace 60a of the second set a contact of microelectronic element 80; by trace 62a to a contact of the third microelectronic element 82; and by trace 64a of the fourth set to a contact of the fourth microelectronic element 84. Other terminals, referred to herein as "unique" terminals are connected to only one microelectronic element. For example, terminal 54b is connected by a trace of the first set 56 to a contact of microelectronic element 70 but is not connected to any other microelectronic element, whereas terminal 54c is connected to a contact of the second microelectronic element 80 but is not connected to any other microelectronic element. The common terminals can be used for connections such as ground and power. Alternatively or additionally, certain types of chips such as common memory chips are used in sets. Some of the signal contacts of the various chips in the set are connected in common, whereas other contacts on each chip must be provided with separate connections. For example, certain dynamic random access memory chips and flash memory chips are used in groups of identical chips. The data, address and command contacts on all of the chips may be connected in common, whereas at least one chip select contact on each individual chip is provided with a unique connection, not shared with any other chip in the group. In implementing such an arrangement in the assembly of FIG. 1, the chip select contacts would be connected to unique terminals, whereas the data, address and command contacts of two or more of the chips, and typically all of the chips, would be connected to the same common terminals.

The assembly desirably is fabricated in the flat or unfolded condition shown in FIGS. 1 and 2. Thus, the chips may be mounted to the sheet and connected to the traces using conventional wire bonding equipment and processes. The encapsulant may be applied after formation of the wire bonds, also using conventional techniques. The assembly is tested while still in the flat condition. In a test procedure, the terminals 54 may be engaged with a test fixture (not shown) and the assembly may be operated by signals supplied through the test fixture. As a result of the test, defective chips may be removed and replaced and defective wire bonds may be repaired. Alternatively, and in accordance with an aspect of the invention, side panels with defective chips may be cut-off or disabled as described further below. Although only a single cruciform sheet unit 20 is depicted in FIG. 1, the sheet unit may be supplied and handled as part of a larger sheet or a continuous or semi-continuous tape. The chips may be attached and connected while the unit remains as part of the larger sheet or tape. After connection of the individual chips and either before or after testing, the cruciform sheet unit is cut away from the remainder of the sheet. The cruciform shape may be formed at this stage of the manufacturing process.

After the flat, generally cruciform unit has been fabricated and assembled, it is folded as seen in FIGS. 3a and 3b so as to form the stacked assembly. In the folding step, the first side panel 28 is folded by bending the fold region 28a of that side panel about a fold axis 100 parallel to the first edge 36 of the core panel so as to form the fold region 28a into a first bight or folded portion 28a' (FIG. 3a) extending upwardly from the core panel 26 along the first edge of the core panel and so as to bring the outboard end of the first side panel 28 bearing the first microelectronic element 70 into alignment with the core panel 26. Next, the second side panel 30 is folded by bending the fold region 30a (FIG. 1) about a fold axis 102 parallel to the second edge 38 of the core panels so as to form the fold region 30a into a second bight or folded portion 30a' extending upwardly from the second edge 38 of the core panel and so as to bring the outboard region of the second side panel 30 bearing the second microelectronic element 80 into alignment with the core panel. The third side panel 32 is similarly folded by bending its fold region 32a about a fold axis 104 parallel to the third edge 40 of the side panel to form a third bight or folded portion 32a' (FIG. 3A) extending upwardly from the third edge 40 of the core panel. The fourth side panel 34 is similarly folded by bending its fold region 34a around a fold axis 106 parallel to the fourth edge 42 of the core panel so as to form a fourth bight or folded portion 34a' (FIG. 3b) extending upwardly from the fourth edge 42 of the core panel. The folding action reverses the orientation of the sheet in the outboard portions carrying the microelectronic elements. Thus, the obverse face 22 of the outboard portion of first side panel 28 faces downwardly towards the obverse surface 22 of that portion of the sheet constituting the core panel 26. The first microelectronic element 70 projects downwardly toward the core panel and engages the compliant layer 69 on the obverse face of the core panel. The obverse face 22 of the outboard region of the second side panel 30 (FIG. 3B) faces downwardly towards the reverse face of the first side panel 28. Likewise, the outboard portions of side panels 32 and 34 have their obverse faces facing downwardly towards the reverse face of the next lower side panel in the stack. In this manner, the microelectronic elements are stacked one above the other and are at least partially aligned with one another in horizontal directions indicated by arrows H in FIGS. 3A and 3B. The core panel 26 is disposed at the bottom of the stack, leaving terminals 54 exposed to the bottom of the stack through holes 55 (FIG. 2).

The bights or folds 28a'–34a' need not have the precise configuration depicted in FIGS. 3a and 3b. For example, each bight may have a constant radius of curvature or a progressively varying radius of curvature. As best appreciated with reference to FIGS. 3a and 3b, the different bights have different dimensions in the vertical direction of the stack, indicated by arrows V. For example, the first bight 28a' extends vertically from the core panel 26 to above the first microelectronic element 70. By contrast, the fourth bight 34a (FIG. 3b) extends in the vertical direction V from the core panel 26 past all four microelectronic elements 70, 80, 82 and 84. However, because the fold regions 28a, 30a, 32a and 34a were of different lengths in the flat, unfolded condition (FIG. 1), and because the longer fold regions are used to form the bights having larger vertical extent, the various bights formed will have substantially the same horizontal dimensions (in directions H). The height of the assembly, and the differences in the lengths of the fold regions, are greatly exaggerated in the drawings for clarity of illustration. In practice, the entire assembly typically is a few millimeters in height and the differences in lengths between the various fold regions amount to a few millimeters or a few tenths of a millimeter.

The assembly is retained in the folded condition by adhesive layers 108 disposed between each microelectronic element and the reverse surface of the next lower side panel in the stack. The thicknesses of these adhesive layers are greatly exaggerated in FIGS. 3A and 3B for clarity of illustration.

The completed assembly can be mounted on a conventional circuit board or other circuit panel 92 using the bonding material masses 90 such as solder balls applied on the terminals 54 to connect the terminals with contact pads 93 on the circuit board. The solder balls may be placed on the terminals before or after the folding operation. The assembly is placed on the circuit panel with the core panel 26 at the bottom, facing toward the circuit panel and the terminals 54 (FIGS. 1 and 2) are bonded to contact pads of the circuit panel. The assembly occupies an area of the circuit panel only slightly larger than the horizontal dimensions of the core panel and only slightly larger than the horizontal dimensions of an individual chip. Yet, the assembly provides connections between the circuit panel and each of the four chips in the stack. These connections are made through relatively short traces. The maximum length of any trace connecting any individual chip to any one of terminals 54 physically is less than or equal to the length of a single side panel plus the dimension across the core panel. The use of relatively short traces limits the inductance and capacitance associated with the traces and limits the time required for signal propagation between the chips and the terminals. This is particularly useful where the assembly is to be operated at high frequencies. Moreover, although there are some minor differences in the lengths of the side panels and hence minor differences between the lengths of the traces in various sets, these differences are small in proportion to the total lengths of the traces. Thus, the ratio between the length of the longest trace in any one set on one side panel and the length of the longest trace in any other set on another side panel desirably is less than about 2:1, more desirably less than about 1.5:1 and still more preferably less than about 1.2:1. The ratio between the maximum self inductance of a trace in any one set and the maximum self inductance of a trace in any other set desirably also is less than about 2:1 more desirably less than 1.5:1. The capacitance of the traces in the various sets desirably are also substantially equal and the same preferred ratios apply. These factors help to assure that the signal propagation delays between the terminals and the contacts of the various chips are substantially uniform. This also contributes to successful high-speed operation.

The compliant layer 69 between the bottom chip 70 in the stack and the bottom or core panel 26 helps to assure that the terminals on the core panel are movable with respect to the this chip 70. The bights 28A'–34A' and those portions of the traces extending along the sheet in the bights desirably remain somewhat flexible and thus allow some movement of the bottom or core panel 26 with respect to the remainder of the stack. Such movement can occur, for example, in response to differential thermal expansion. As discussed in greater detail in the aforementioned '265 patent, semiconductor chips and circuit boards can undergo differential thermal expansion and contraction during operation, due to differences in coefficients of thermal expansion and differences in temperature. Similar effects can occur during manufacturing processes as, for example, when the terminals 54 are initially bonded to the contact pads 93 of a circuit panel using a high temperature process such as solder reflow and the assembly is subsequently cooled to room temperature. Allowing the terminals 54 to move relative to the chips in response to such differential thermal expansion relieves some or all of the stress which otherwise would be applied in the bonds 90 between the terminals 54 and the contact pads 93 of the circuit panel.

An assembly in accordance with another embodiment of the invention (FIGS. 4–7) incorporates a unitary sheet component 120 similar to the sheet 20 discussed above with reference to FIGS. 1–3B. However, sheet 120 has conductive elements on both its observe surface 122 and reverse surface 124. Thus, the sheet may include a dielectric layer 150 with layers of metallization 152 and 151 on the obverse and reverse sides of the dielectric layer. Solder mask layers may be provided on both surfaces as well. The terminals 154 on the core panel may be in the form of vias extending through the dielectric sheet.

Figure 4:
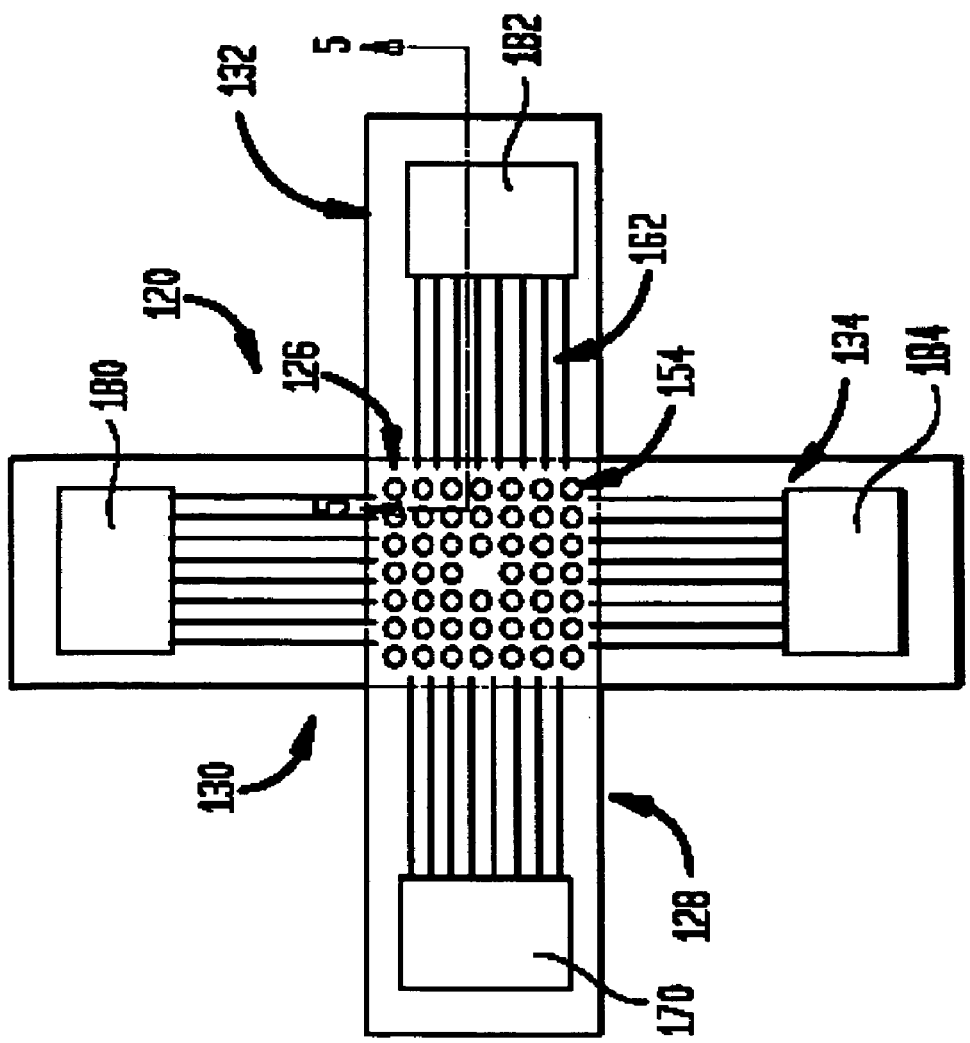
FIG. 4 is view similar to FIG. 1 but depicting a component according to another embodiment of the invention.
Figure 5:
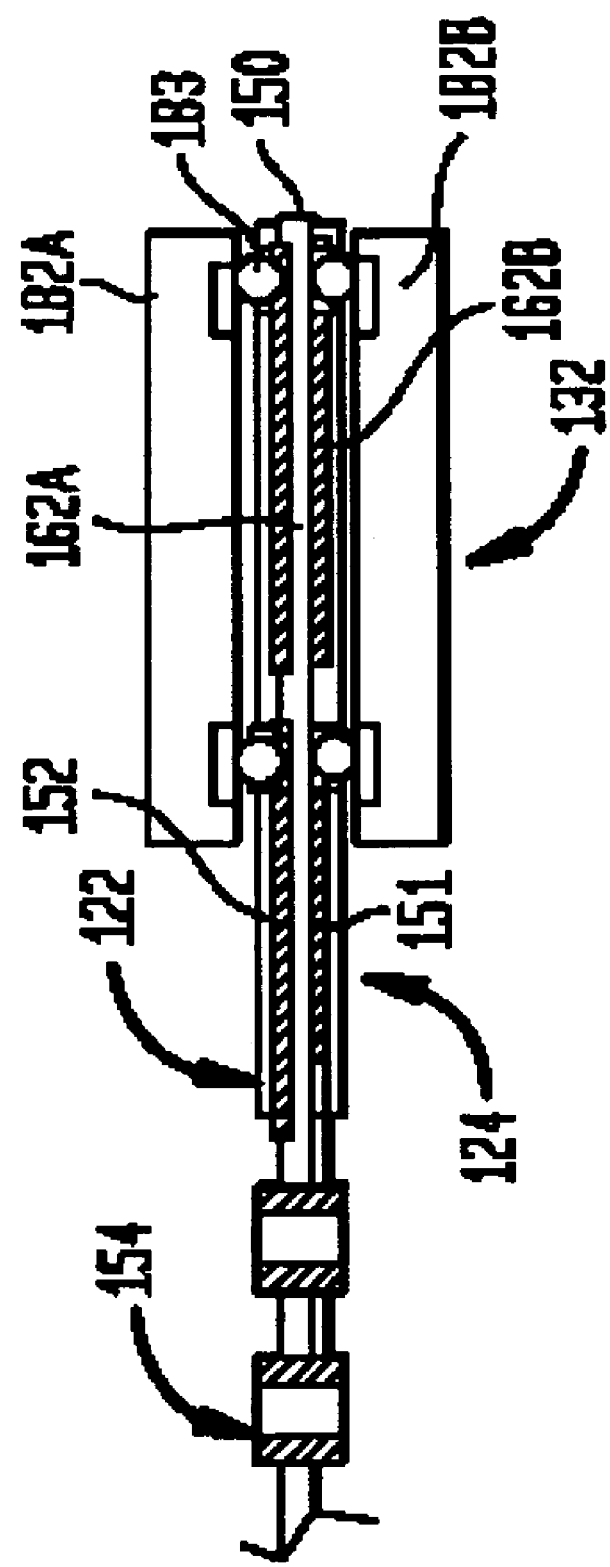
FIG. 5 is a fragmentary, diagrammatic sectional view taken along line 5—5 in FIG. 4.

As in the embodiments discussed above, the sheet 120 is of generally cruciform shape and includes four side panels 128, 130, 132 and 134 projecting from edges of the core panel 126. As best seen in FIG. 4, the four side panels 128, 130, 132 and 134 are of substantially equal length and have fold regions of substantially equal length. Here again, each side panel includes a fold region adjacent the core panel and a set of traces extending across the fold region. The set of traces on each side panel desirably includes traces formed on both obverse and reverse surfaces. For example, the set of traces 162 on the third side panel 132 includes traces 162a (FIG. 5) formed from the metallization layer 152 on the obverse surface and traces 162b formed from the metallization layer 151 on the reverse surface 124. Although only portions of these traces are seen in FIG. 5, it should be appreciated that the traces within each set desirably extend across the fold region of the side panel and extend to the core panel.

Figure 6:
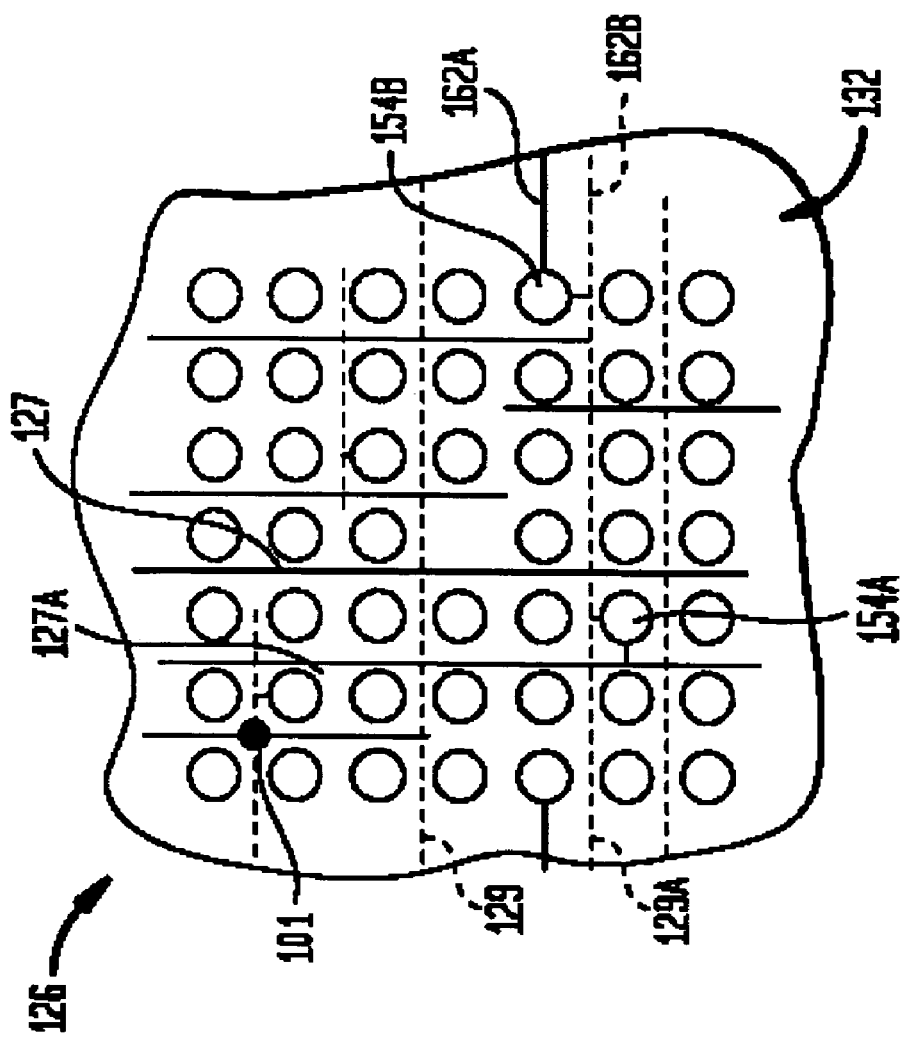
FIG. 6 is a fragmentary, diagrammatic plan view on an enlarged scale depicting a portion of the component shown in FIG. 4.

The traces extending within the core panel desirably include traces extending in mutually perpendicular directions on obverse and reverse sides of the sheet. Thus, as best seen in FIG. 6, traces extending within the core panel on the obverse side of the sheet include first interconnect traces 127, seen in solid lines, extend generally upwardly and downwardly as seen in FIG. 6 and, hence, extending generally parallel to the direction of elongation of the second side panel 130 and fourth side panel 134 (FIG. 4). Second interconnect traces 129 on the reverse side of the sheet within the core panel, seen in broken lines in FIG. 6, extend in a direction perpendicular to the traces 127. Thus, traces 129 extend generally in the directions of elongation of first and third side panels 128 and 132. This greatly facilitates routing and connections to common terminals. For example, terminal 154a is a common terminal connected to all of the sets of traces on all four side panels. The terminal is connected to a trace 127a extending entirely across the core panel on the obverse side and to another trace 129a extending entirely across the core panel on the reverse side. These traces can continue entirely across the core panel without interfering with other traces. These traces can continue onto the side panels and can form parts of the sets of traces incorporated in the side panels. For example, trace 129a is continuous with one of the traces 162b on the reverse side of third side panel 132. Moreover, the via structures extending through the dielectric can be used to connect traces on opposite sides of a single side panel. Thus, trace 129a is connected through via 154b to another trace 162a on the obverse side of the third side panel 132. Similar arrangements can be used to connect other traces in the core panel with traces on the side panels. Thus, common terminals can be connected readily to traces on both sides of all side panels. Of course, the same techniques can be used to connect any particular terminal 154 to traces on less than all of the side panels or to only one trace on only one side of a side panel, so as to provide unique terminals which will be connected to only one chip. For further versatility, additional vias 101 (FIG. 6) can be provided at crossing points of the traces. These additional vias need not serve as terminals. Still other vias and interconnections can be provided on the side panels for interconnecting traces on a particular side panel with one another.

The microelectronic elements used in this embodiment include a pair of semiconductor chips mounted on each side panel adjacent the outboard end thereof. As best seen in FIG. 5, the pair of semiconductor chips mounted on the third side panel 132 includes an obverse-side chip 182a mounted on the obverse side of the sheet and a reverse-side chip 182b mounted on the reverse side of the sheet. These chips are mounted in "flip-chip" orientation relative to the sheet, with the contact-bearing sides of the chips facing toward the sheet and the contacts of the chips being bonded to bond sites on the traces by conductive bonding materials such as small solder balls 183. The rear surfaces of the chips, opposite from the contact-bearing surfaces, face away from the sheet. Techniques normally used in flip-chip bonding as, for example, underfilling the region between each chip and the sheet with a dielectric underfill material such as an epoxy may be employed. Also, instead of conventional flip-chip bonding, techniques such as mounting with an anisotropic conductive adhesive, also referred to as a "z-conducting" adhesive, can be utilized. Further, although the pair of chips shown in FIG. 5 are depicted as exactly aligned with one another in directions along the plane of the sheet, each pair of chips on a particular side panel may be offset somewhat from one another in these directions. Similar pairs of semiconductor chips 170, 180 and 184 are provided on the other side panels.

Here again, the assembly is fabricated and tested while the sheet is in a flat condition and preferably while the sheet is part of a larger sheet or tape. In accordance with an aspect of the invention, side panels with defective chips may be cut-off or disabled (described further below). After fabrication and desirably after testing, the sheet is folded in substantially the same as discussed above with reference to FIGS. 1–3B. Here again, each side panel is folded by bending its fold region about an axis parallel to the associated edge of the side panel, so as to swing the outboard ends of the side panels, bearing the microelectronic elements, into alignment with the core panel 126. Here again, the folding action forms the fold region of each side panel into a bight extending upwardly along an edge of the side panel. Because the fold regions of the various side panels are of equal length, the bights project outwardly from the side panel in horizontal directions by different amounts. For example, bight 130a' has a lesser vertical extent and, hence, a greater horizontal extent than bight 134a'.

Figure 7:
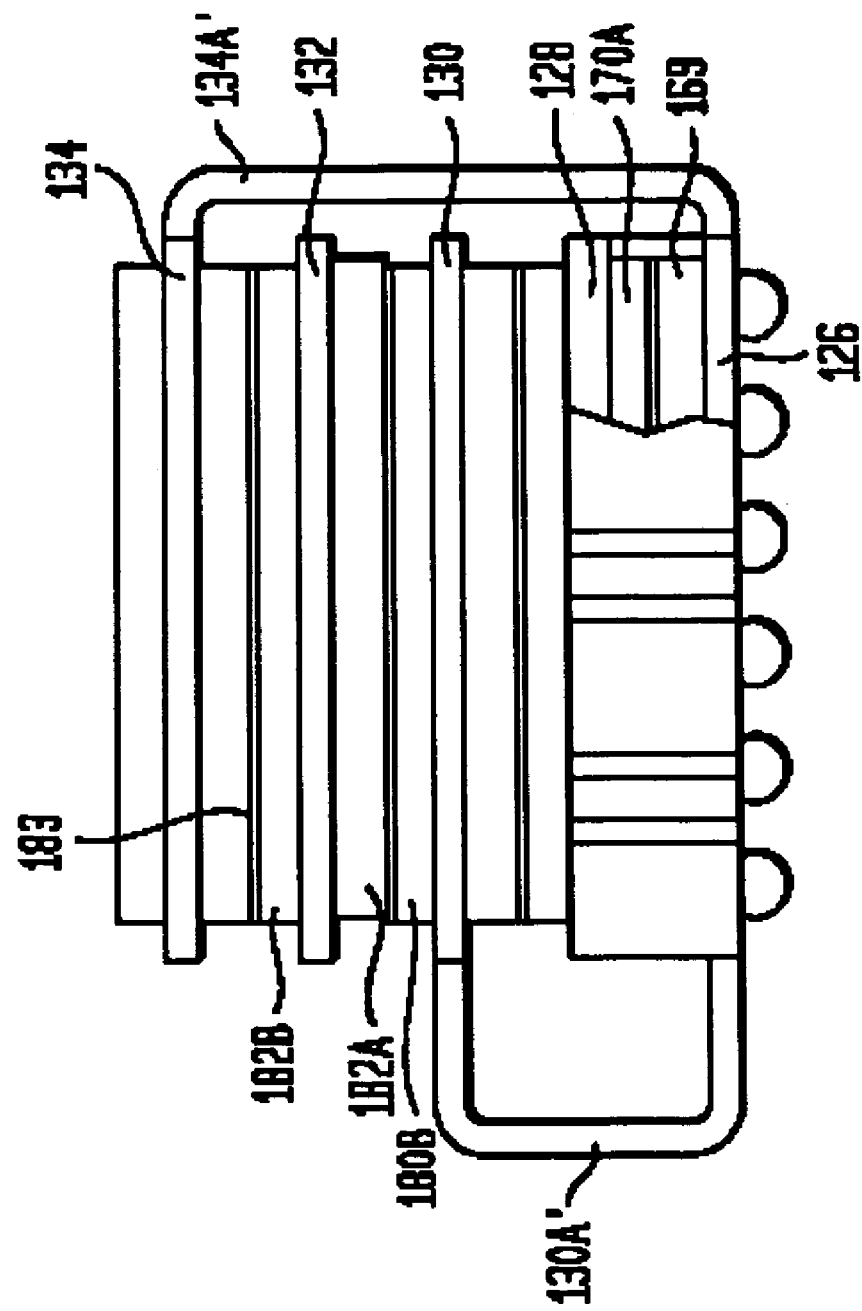
FIG. 7 is a view similar to FIG. 3B depicting the assembly made using the component of FIGS. 4–6.

As in the embodiment discussed above with reference to FIGS. 1–3B, the folding action brings the chips on the various side panels into alignment with one another and into alignment with the core panel. The obverse-side chip of each side panel faces downwardly, toward the core panel, whereas the reverse side chip on each side panel faces upwardly, away from the core panel. Thus, the rear surface of each chip confronts the rear surface of a chip on the neighboring side panel. For example, as shown in FIG. 7, the rear surface of the obverse-side chip 182a on third side panel 132 confronts the rear surface of the reverse-side chip 180b on the second side panel 130. The obverse-side chip 170a on the first or lower most side panel 128 confronts the core panel. Here again, a compliant layer 169 may be incorporated in the assembly, as by applying such a compliant layer prior to folding to provide mechanical decoupling between the stacked chips and the core panel 126 and, hence, mechanically decouple the terminals on the core panel from the stacked chips. The confronting rear surfaces of the stacked chips may be bonded to one another by thin layers of an adhesive 183. The adhesive layers optionally may be compliant. However, here again, the stack of chips tends to expand and contract as a unit, so that stresses due to differential thermal expansion and contraction within the stack of chips are minimal. Adhesive 183 may incorporate thermally conductive materials to facilitate heat transfer within the stack.

A package as shown in FIG. 7 can be mounted on a circuit panel in the same manner as discussed above. The package of FIGS. 4–7 provides a particularly efficient stacking arrangement; eight chips are accommodated in a package having horizontal dimensions only slightly larger than the horizontal dimensions of a single chip. Moreover, the vertical dimensions of the package are only slightly larger than the aggregate thicknesses of the chips themselves.

Figure 8:
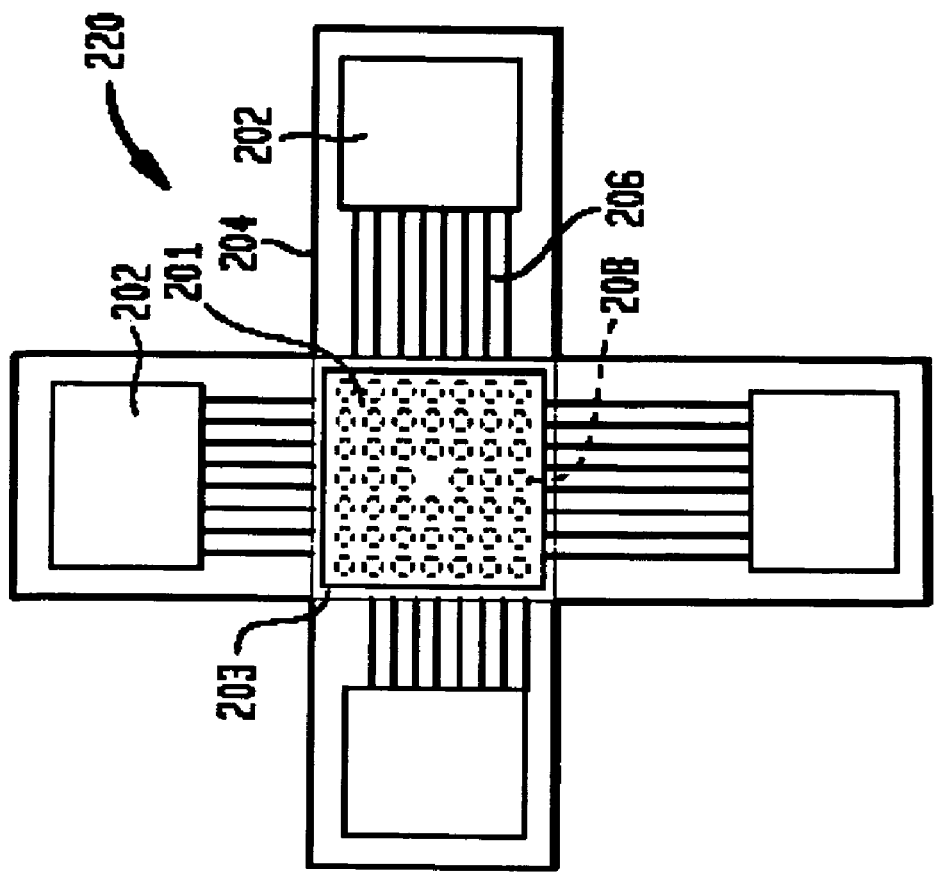
FIG. 8 is a view similar to FIG. 1 but depicting a component according to yet another embodiment of the invention.

An assembly according to a further embodiment of the present invention, illustrated in FIG. 8, includes a sheet component 220 which may be similar to the components discussed above. A core panel microelectronic element such as a semiconductor chip is mounted on the obverse surface of the core panel 203. Here again, further microelectronic elements such as additional semiconductor chips 202 are mounted on the side panels 204. In this embodiment as well, each side panel is provided with a set of traces 206 extending outwardly from the core panel and extending across the fold region of the side panel, adjacent the core panel. At least some of the traces 206 on at least one of the side panels 204 connect at least one of the side panel microelectronic elements 202 to the core panel microelectronic element 201. Most commonly, all of the side panel microelectronic elements are connected to the core panel microelectronic element 201 through the traces 206. Terminals 208, seen in broken lines in FIG. 8, are provided on the core panel and exposed at the reverse side of the sheet for connection to an external circuit. At least some of these terminals are connected to the core panel microelectronic element 201, to the side panel microelectronic elements 202 or both. In one useful application of this arrangement, the core panel microelectronic element is a microprocessor chip, whereas the side panel microelectronic elements 202 are memory chips arranged to cooperate with the microprocessor chip. Most preferably, the core panel microelectronic element 201 is connected to the core panel so that the terminals 208 on the core panel remain moveable with respect to the core panel microelectronic element. For example, the core panel microelectronic element may be connected to terminals 208 through flexible leads (not shown) of the type discussed in the aforementioned '265 and '977 patents, or of the type discussed in U.S. Pat. No. 5,518,964, the disclosure of which is hereby incorporated by reference herein. Still other forms of flexible leads disclosed in preferred embodiments of U.S. Pat. Nos. 6,054,756 and 5,977,618, the disclosures of which are also incorporated by reference herein, may be employed. The arrangements taught in the '964; '756; and '618 patents also may be used for mounting the chips or other microelectronic elements on the side panels. In certain embodiments taught in the aforementioned patents, a compliant layer is provided between a chip and terminals disposed beneath the chip. Such a compliant layer may be provided between the core panel microelectronic element 201 and terminals 208 as, for example, between the core panel microelectronic element and the core panel. As in the embodiments discussed above, the side panel microelectronic element 202 may include a single chip on each side panel or else may include pairs of chips as discussed above with reference to FIGS. 4–7 or may include elements other than chips as, for example, passive components such as inductors, capacitors or resistors. The traces 206 may be provided on one or both sides of the sheet. The assembly shown in FIG. 8 can be folded in a manner similar to that described above, once again bending each side panel by folding it around a fold axis parallel to an edge of the core panel so as to stack the side panel microelectronic elements 202 over the core panel 203. In this arrangement, the lower most side panel chip 202 may be bonded directly to the surface of the core panel chip 201 facing away from the core panel. Because the core panel chip is moveable with respect to the terminals, the stack of side panel chips will also remain moveable with respect to the terminals, provided that at least the folded portions of the side panels remain flexible.

Numerous variations and combinations of the features discussed above can be utilized. For example, the sheet component can include more than two layers of conductive elements. The sheet can include, for example, a continuous or substantially continuous conductive plane to serve as a ground or power plane. Such a conductive plane can be provided on any portion of the sheet or on all portions of the sheet. As described, for example, in U.S. Pat. No. 6,239,384, the disclosure of which is also incorporated by reference herein, the traces may cooperate with such a conductive plane to form striplines having controlled impedance. As also described in the '384 patent, the traces may be provided as groups of plural, mutually-parallel traces to provide controlled-impedance signal paths.

Figure 3:
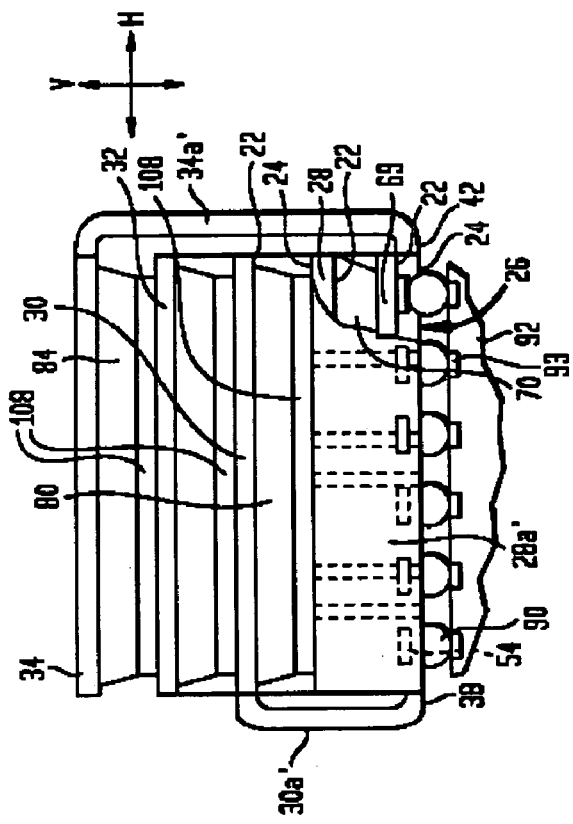
FIGS. 3A and 3B are diagrammatic front and side elevational views of a stacked microelectronic assembly formed from the component of FIG. 1.

Also, pairs of side panel chips, as discussed above with reference to FIG. 5, can be provided using a component having only a single layer of traces extending along the side panels. In such an arrangement, holes are provided in the dielectric layer of the side panel and the chip disposed on the opposite of the dielectric layer from the traces is connected to the traces through the holes. In the arrangement of FIGS. 1–3, the traces are provided on the obverse side. The traces also can be provided only on the reverse side. Similarly, the chips can be mounted on either side of the sheet. In a further variant, the traces and terminals can be provided in one or more layers within the thickness of the dielectric layer, rather than in a surface of the dielectric layer. In yet another variant, the sheet is formed from a material which is not normally regarded as flexible, i.e., a material which will not flex, to an appreciable degree, during use. However, the sheet is forcibly bent and permanently deformed during the folding process. The sheet, or at least the fold regions of the side panels, may be brought temporarily to a deformable condition during the folding process. Where the sheet incorporates a thermoplastic material, this may be accomplished by heating it. Alternatively, the sheet may be initially in a foldable condition and then may be set to a more rigid condition after folding. Thus, the sheet may incorporate an epoxy or other settable composition which is not fully cured prior to folding and which is cured after folding. Further, it is not essential, in all embodiments, to provide for movability of the stacked chips relative to the terminals. Merely by way of example, the assembly can be mounted to a circuit panel using a connection which itself is capable of compensating for the effects of differential thermal expansion.

In the embodiments discussed above, the assembly is mounted with the terminal-bearing core panel facing downwardly toward a circuit panel such as a circuit board. However, the assembly can be mounted in other orientations as, for example, with the terminal-bearing panel facing upwardly away from a circuit panel and connected to the circuit panel by wire bonds or the like. In yet another arrangement, terminals 301 (FIG. 9) are provided on one or more of the fold regions of the sheet so that these terminals are exposed to the exterior surface of the bight 303 formed from such fold region. These terminals can be bonded to contact pads 305 of a circuit panel 306 as, for example, by solder masses or other conductive material masses 307. These terminals are connected through traces (not shown) on the side panel bearing the terminals to the core panel and to the other side panels. Thus, the stack can be mounted in a sideways orientation, with the core panel 309 extending generally perpendicular to the plane of the circuit.

Figure 9:
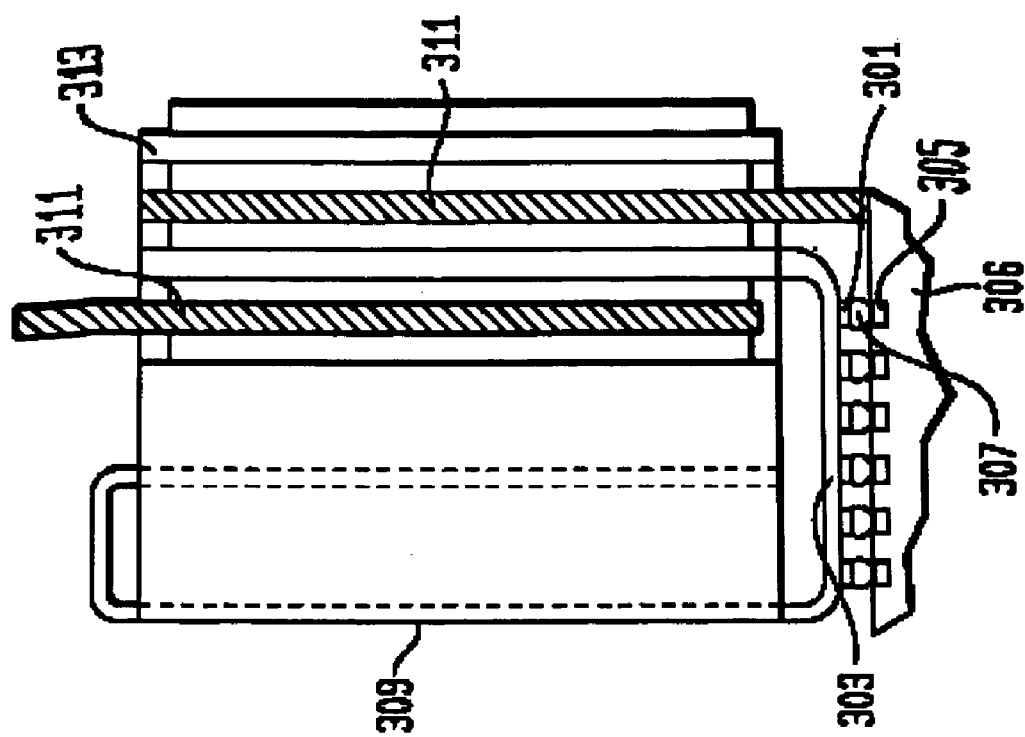
FIG. 9 is a diagrammatic elevational view of an assembly according to a further embodiment of the invention, in conjunction with a circuit panel.

The assembly shown in FIG. 9 also includes thermally conductive elements such as metallic plates 311 projecting out of the sides of the stack between the folded over side panels 313 and between the chips mounted on such side panels. Where the stack is oriented sideways as shown in FIG. 9, one or more of these thermally conductive elements can engage the circuit panel 306. Such conductive elements also can be used in a vertically oriented stack as discussed above with reference to FIGS. 1–8. Moreover, additional thermally conductive elements and additional protective elements as, for example, a "can" or metallic enclosure or a metallic heat spreader may be provided around the stack on one or more surfaces of the stack so as to promote heat dissipation from the stack. Further, the folded stack can be encapsulated or "potted," typically after the folding operation.

Figure 10:
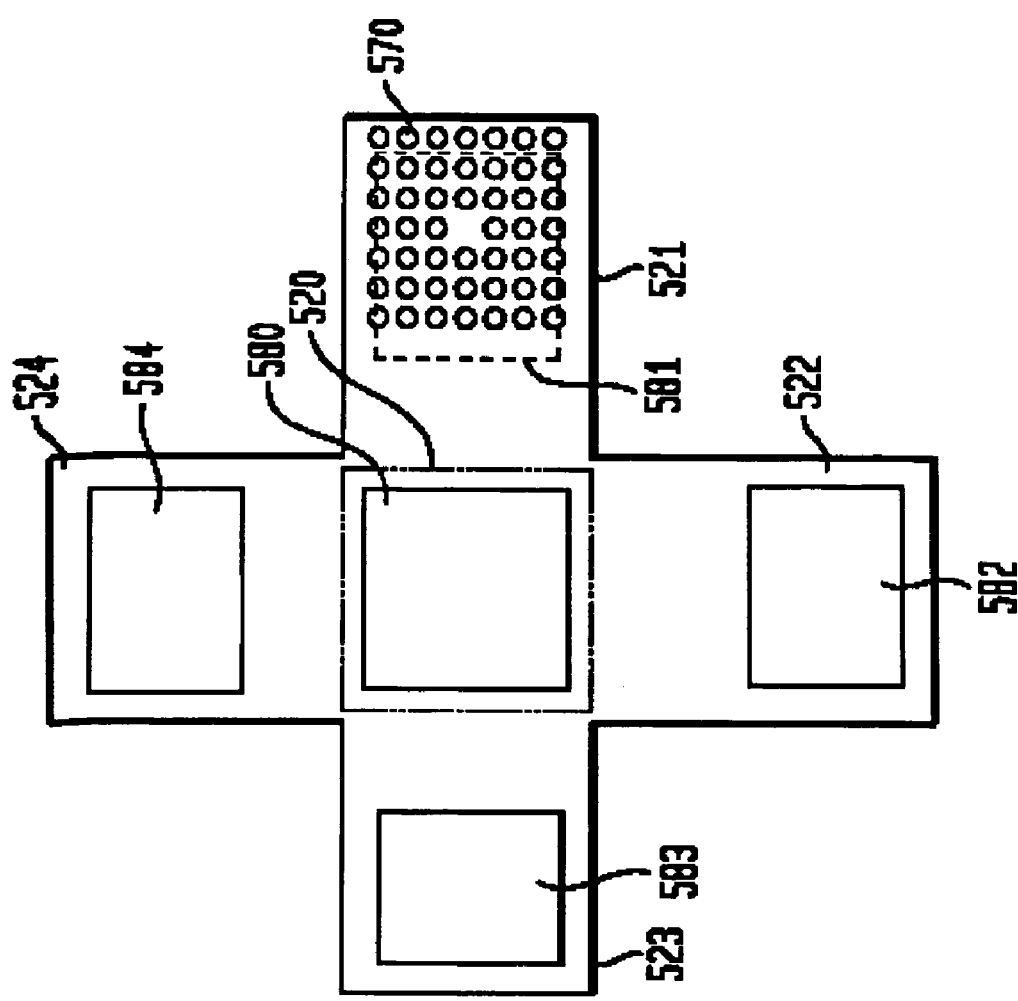
FIG. 10 is a view similar to FIG. 1 but depicting a component according to yet another embodiment of the invention.
Figure 11:
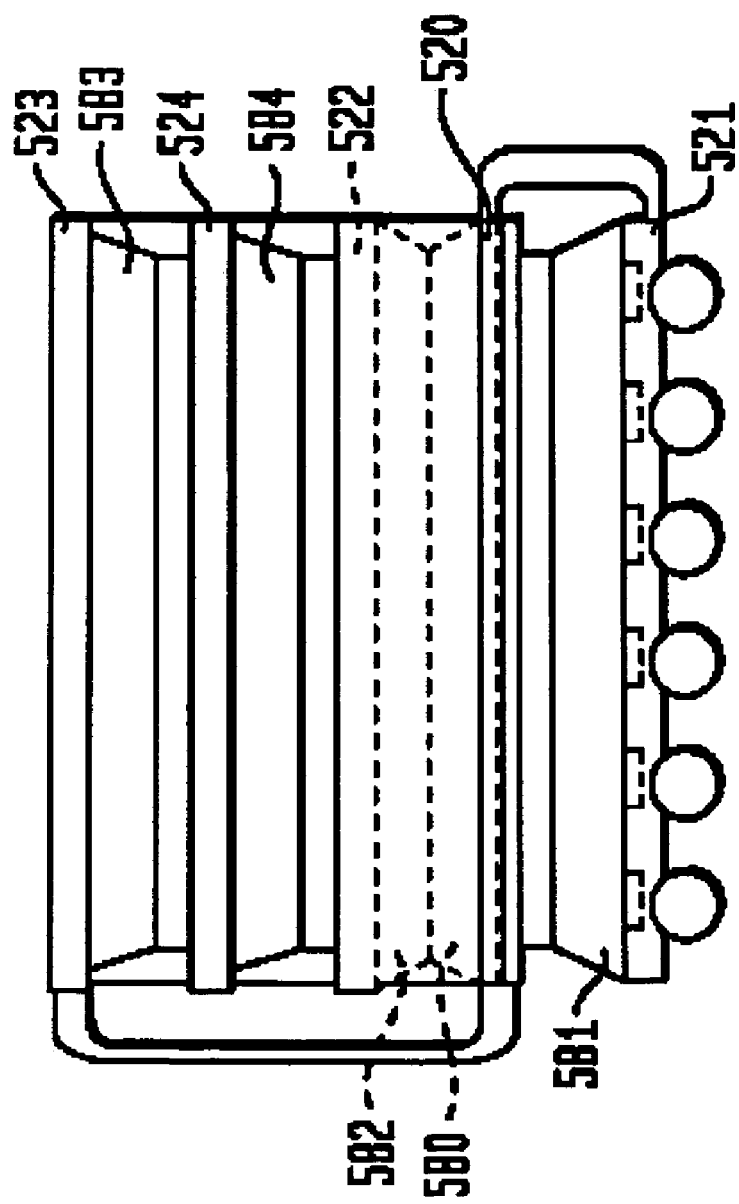
FIG. 11 is a diagrammatic elevational view of a stacked assembly made from the component of FIG. 10.

In an assembly according to a further embodiment of the invention (FIGS. 10–11), the core panel is present at an intermediate level in the stack rather than being at the bottom or top position. In the embodiment of FIGS. 10 and 11, chip 581 is attached to second or reverse surface of side panels 521 and chips 582, 583 and 584 are attached to first or obverse surface of the other side panels 522, 523 and 524. A core panel chip 580 is provided on first of surface core panel 520. Terminals 570 are exposed and accessible at first of surface of side panel 521. The side panels are then folded so that the first surfaces of panels 522, 523 and 524 face toward the first surface of the core panel, in much the same way as discussed above. Side panel 521 is folded in the opposite sense so that panel 521 lies on the opposite side of the core panel from the other side panels, as best seen in FIG. 11. Thus, terminals 570 are exposed and accessible at the end of the stack. As a result, core panel chip 580 is the middle chip of the five-chip stack.

Figure 12:
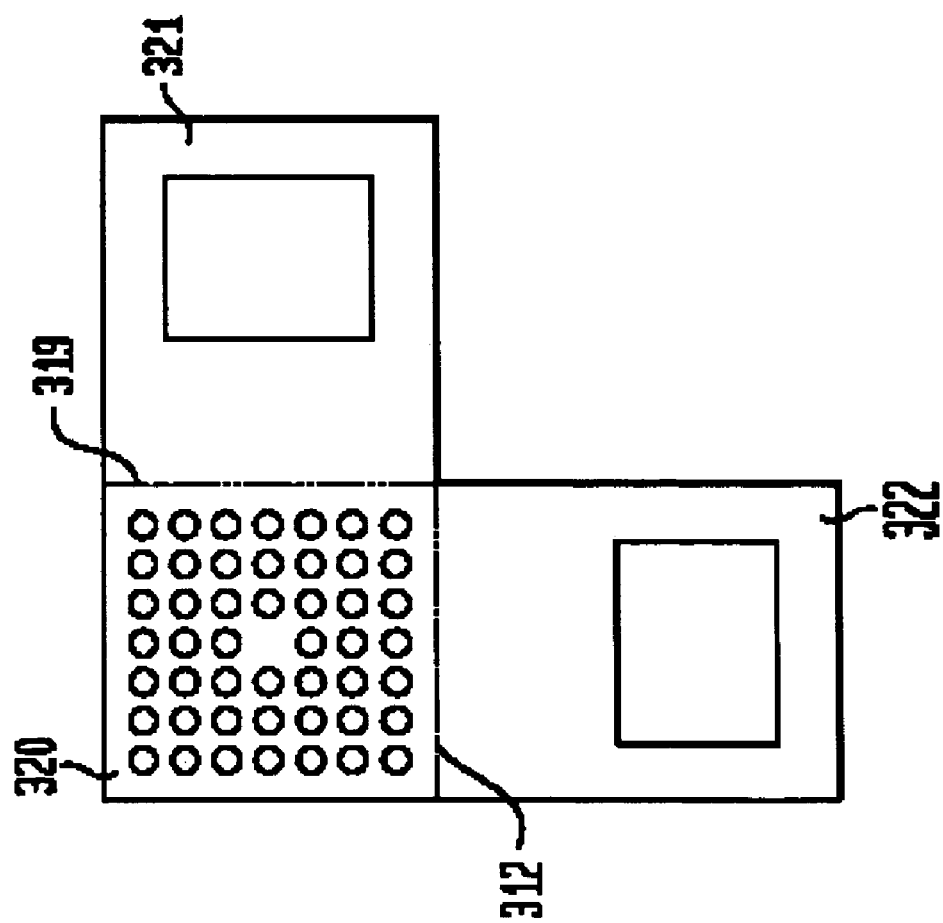
FIGS. 12–18 are plan views similar to FIG. 1 but depicting components according to additional embodiments of the invention.
Figure 13:
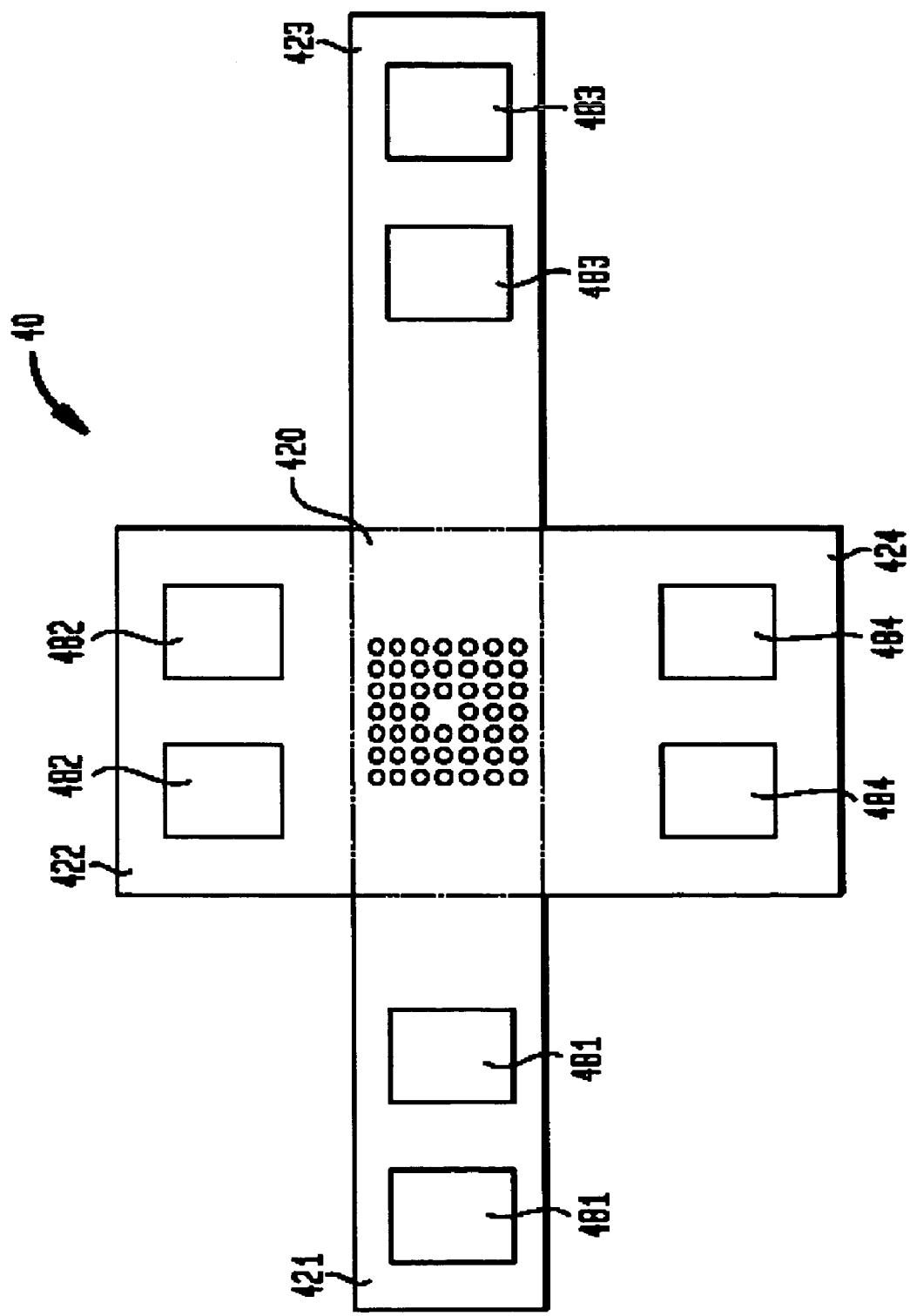
Figure 14:
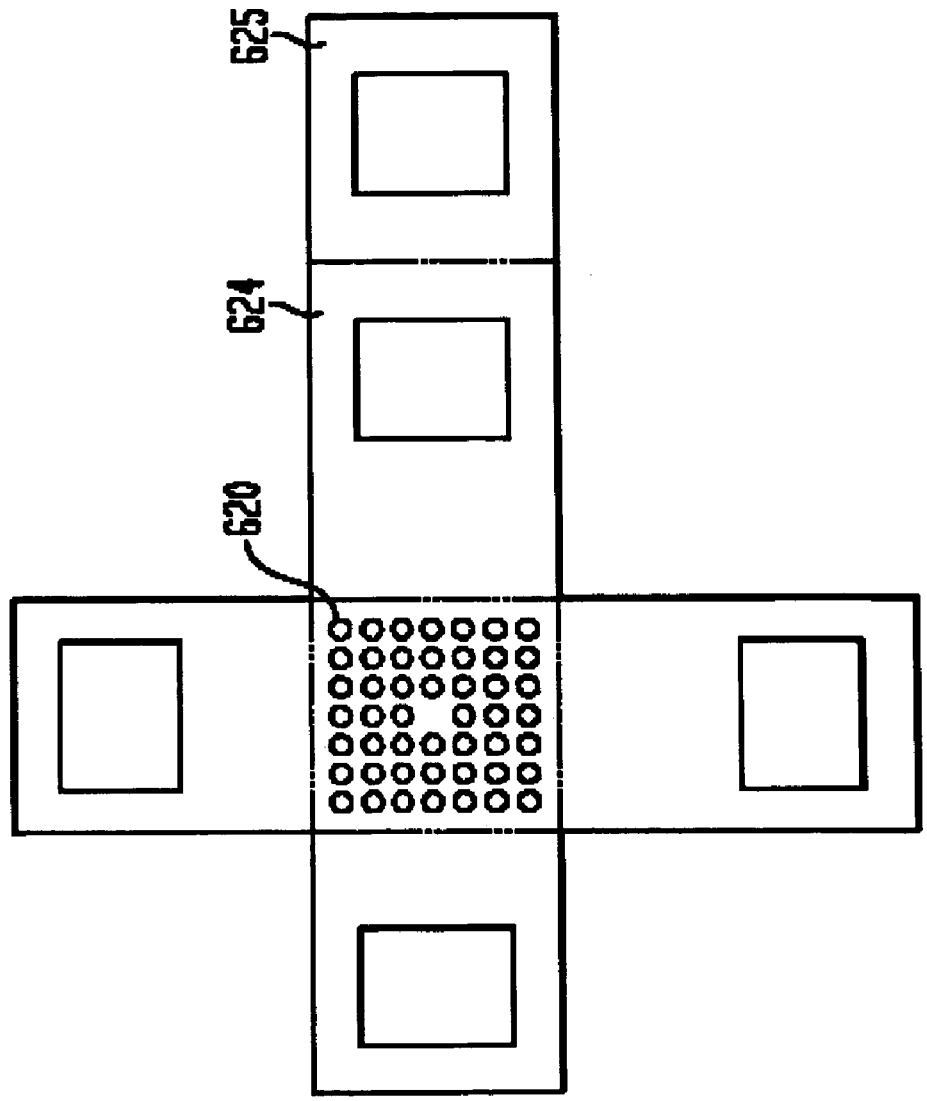
Figure 15:
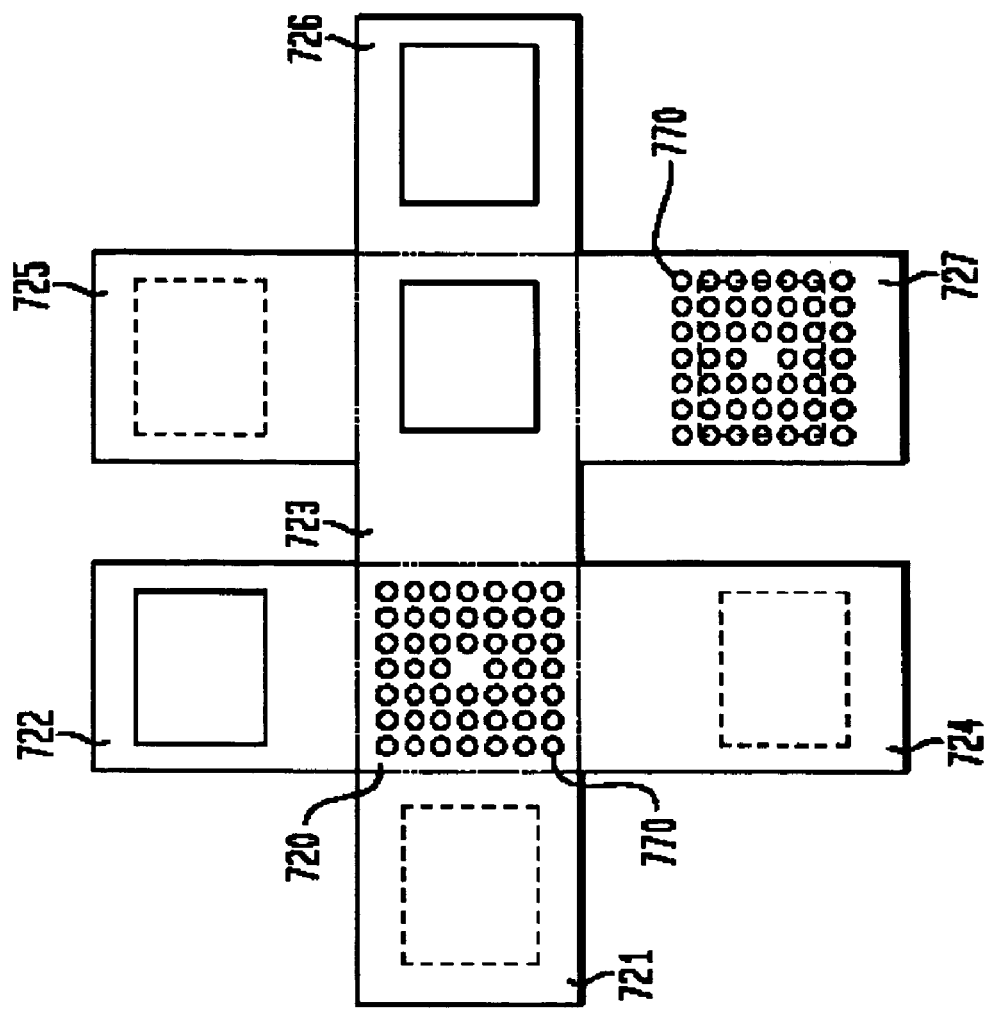

In the embodiments of FIGS. 1–10, the core panel is generally rectangular as, for example, a square, with rectangular side panels extending from each edge of the core panel and a single microelectronic element attached to each side panel. Stacks made from sheets of other configurations are also comprised within the present invention, as are stacks having more than one microelectronic element on a panel. The embodiment of FIG. 12 includes rectangular core panel 320 with only two side panels 321, 322 extending from two non-parallel edges 319, 312 of the core panel. In such a configuration, the side panels are folded over the core panel to create a two-chip stack. In other embodiments, such as the embodiment of FIG. 13, two or more chips 481–484 may be placed side-by-side on each panel 421–424 and the panels folded over the core panel 420 above. Moreover, an additional panel 625 may be connected to one of the side panels 624 as illustrated in FIG. 14. In such a configuration, panel 624 may be folded with its first surface facing the first surface of the core panel, and panel 625 folded with its second surface facing the second surface of panel 624. Other, more complex arrangements of core and side panels are also within the scope of the invention, such as the configuration of FIG. 15. This embodiment may be folded into a stacked assembly, for example, by folding side panel 721 with its first surface facing the first surface of core panel 720, folding panels 722, 724 with their second surfaces facing toward the second surface of core panel 720, folding panels 725, 726 and 727 with their second surfaces facing toward the second surface of panel 723, and folding panel 723 with its first surface facing toward the second surface of core panel 720. Panels 725,726 are folded so that they are positioned between panel 727 and core panel 720 with terminals 770 being exposed at one end of the stack.

Figure 16:
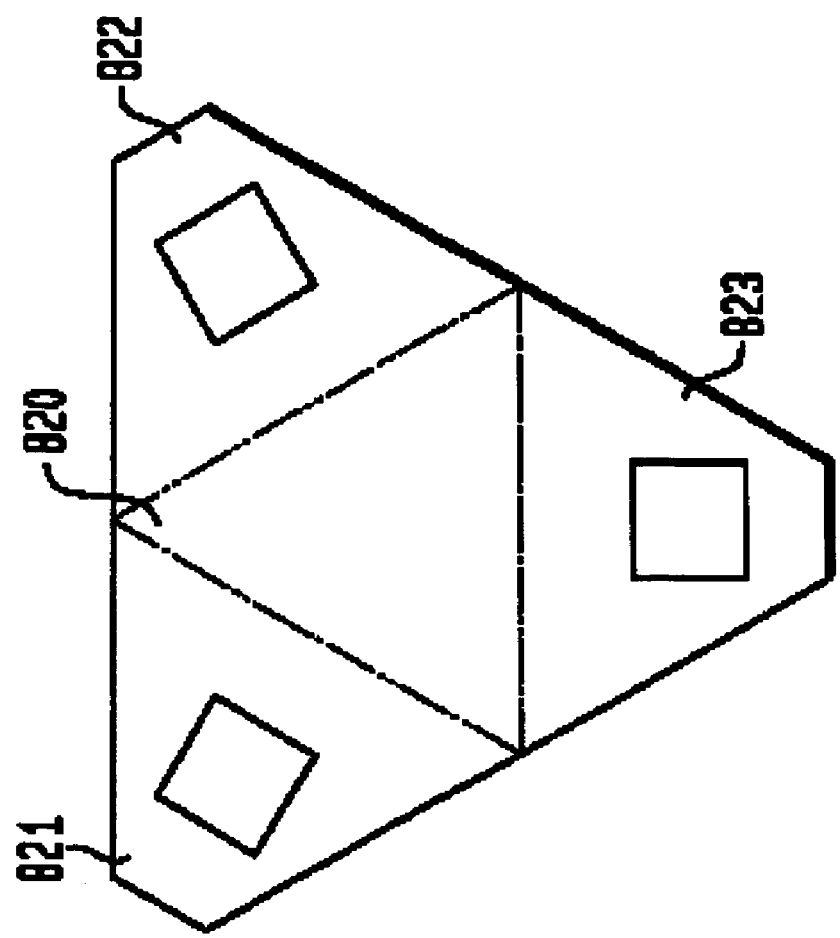
Figure 17:
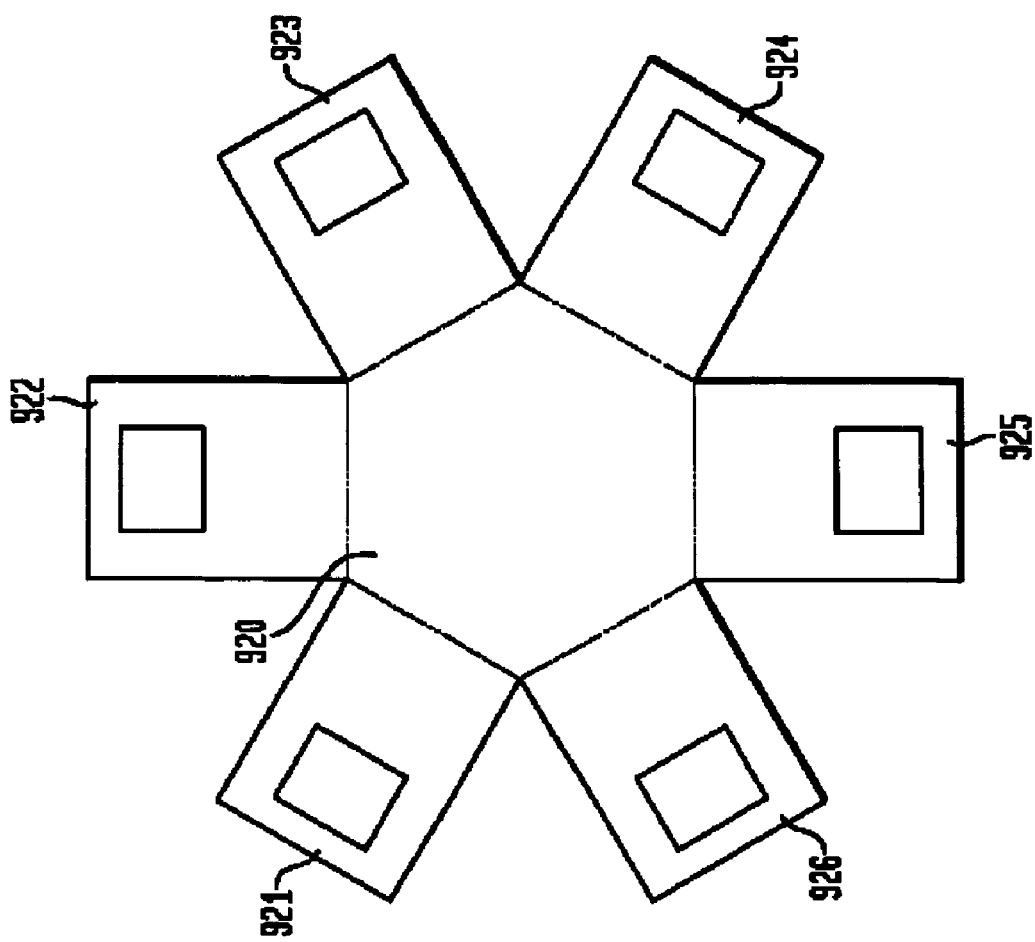

Configurations where the core panel or side panels have shapes other than rectangular are also within the scope of the invention, as illustrated by the triangular core panel 820 and trapezoidal side panels of FIG. 16 and the hexagonal core panel 920 of FIG. 17.

Figure 18:
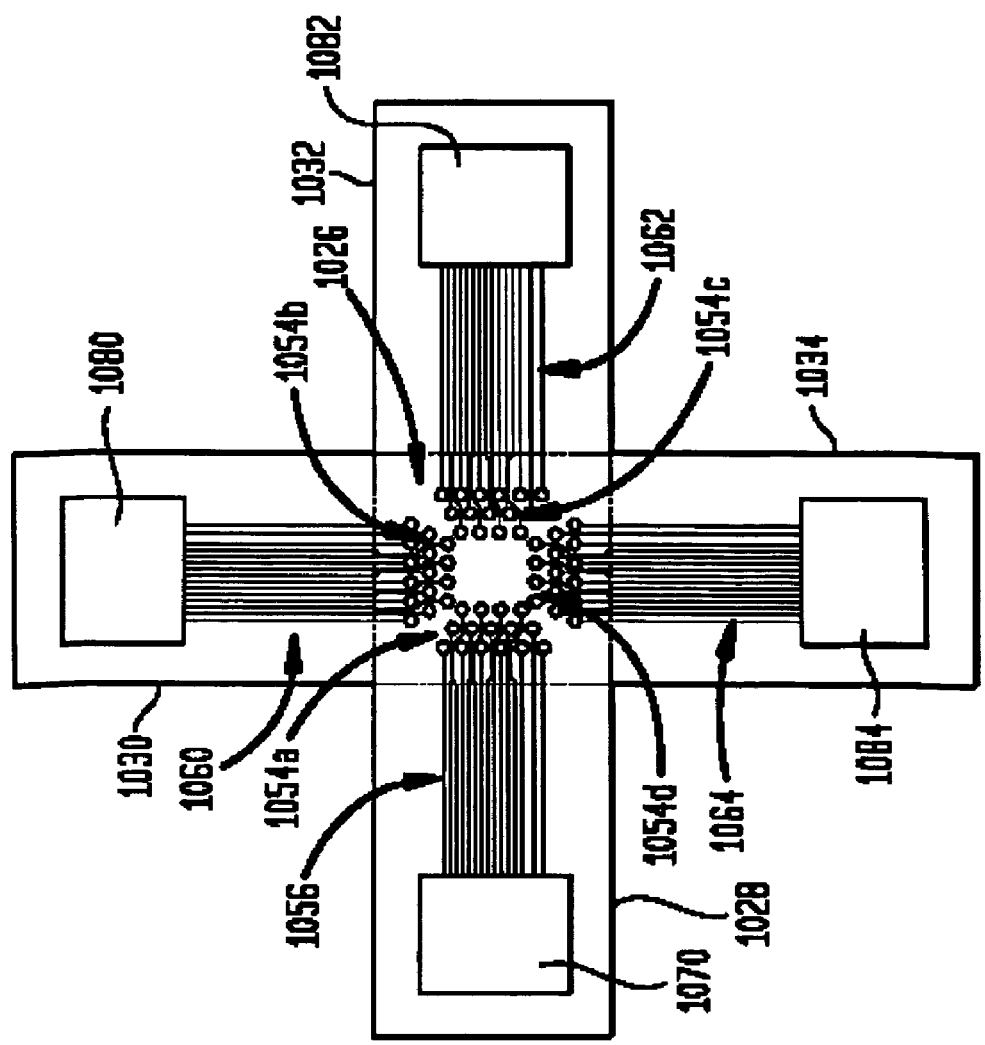
Figure 19:
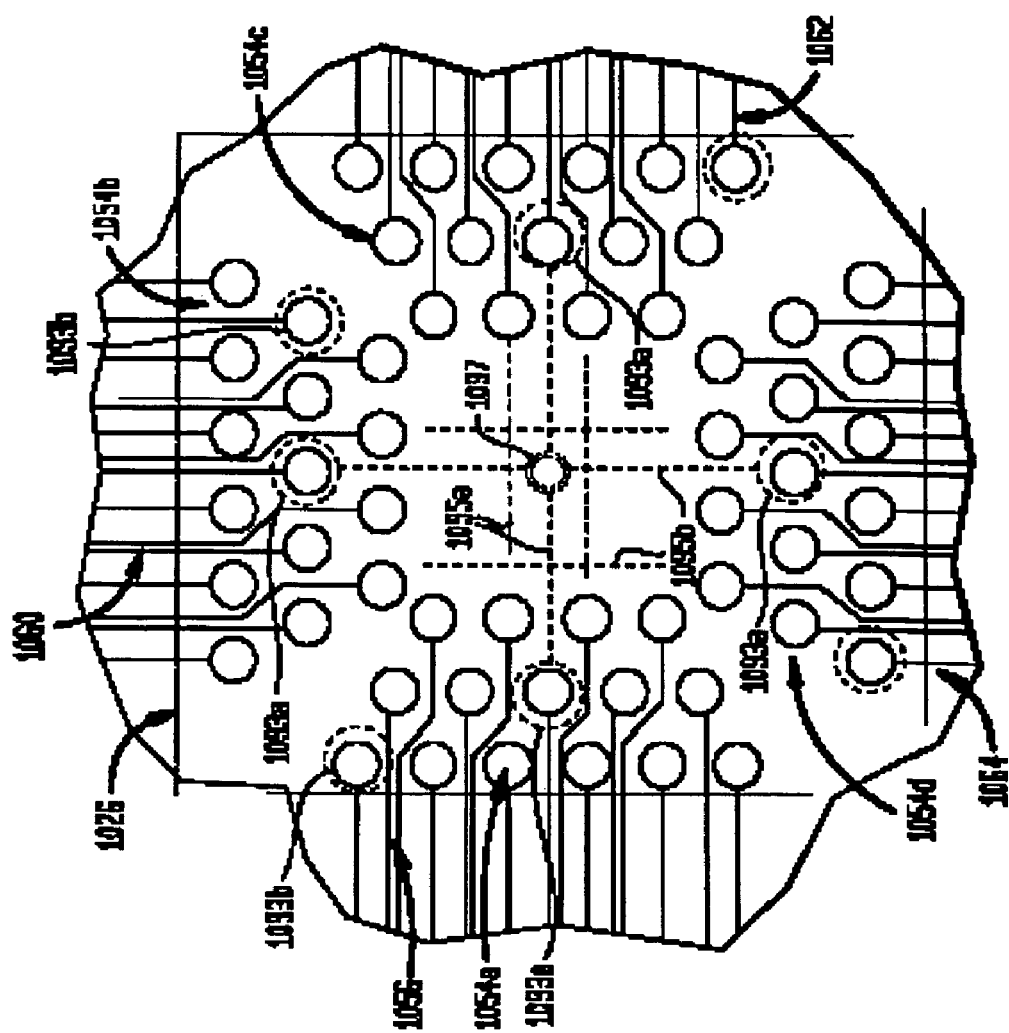
FIG. 19 is a fragmentary, diagrammatic view depicting a portion of the component shown in FIG. 18 on an enlarged scale, in conjunction with elements of a circuit panel.

The assembly shown in FIG. 18 is similar to the assembly shown in FIG. 1. Here again, the sheet unit 1020 includes a core panel 1026 and four side panels 1028,1030,1032 and 1034. Microelectronic elements 1070,1080,1082 and 1084 are mounted on the side panels. As in the embodiments discussed above, each side panel is provided with a set of traces; the first side panel has a first set of traces 1056; the second side panel has a second set of traces 1060; the third side panel has traces 1062 and the fourth side panel has traces 1064. Some or all of the traces on each side panel are connected to the microelectronic element or elements mounted on such side panel, as by connecting the outboard ends of the traces to contact pads (not shown) on the microelectronic element. The core panel 1026 is provided with terminals 1054. In this embodiment, the terminals are provided in groups 1054a, 1054b, 1054c and 1054d, each group being disposed adjacent one edge of the core panel and connected by features on the sheet unit only to the set of traces on the side panel extending from that edge. For example, the first group of terminals 1054a is connected only to traces 1056 of the first set, whereas the second set of terminals 1054b is connected only to traces 1060 of the second set, and so on. As seen in detail in FIG. 19, this arrangement facilitates layout of the traces, particularly where all of the traces are formed as part of a single layer. None of the traces on the sheet cross one another. The sheet is folded as described above so as to provide a stacked assembly. The stacked assembly is mounted to a circuit panel, with terminals 1054 being bonded to contact pads 1093 of a circuit board or other circuit panel. Although only a few contact pads 1093 are depicted in FIG. 19, it should be appreciated that contact pads typically are provided for all or most of the terminals 1054. As discussed above, it is desirable to connect some types of microelectronic elements in the stacked assembly so that some of the contacts on each microelectronic element in the stack are connected in common with the corresponding contacts on other microelectronic elements in the stack. In the embodiment of FIGS. 18 and 19, such common connections are provided by traces 1095 within the circuit board to which the assembly is mounted. Thus, the circuit board includes traces 1095a extending generally in a first horizontal direction and other traces 1095b in another layer extending generally in a second horizontal direction. The arrangement of traces in the circuit board may be similar to the arrangement of crossing traces in the sheet discussed above with reference to FIG. 6. Here again, the traces in the multiple layers can cross one another without interference. The circuit board may include vias 1097 extending between the layers to provide desired interconnections. In many cases, the circuit board must multiple layers metallization to accommodate other circuit features, and hence can include two or more layers of traces for interconnecting the contact pads 1093 with one another at little or no added cost. This arrangement provides common connections as desired. For example, contact pads 1093a are connected in common with one another, thereby connecting the particular terminals 1054 overlying those contact pads in common with one another. Contact pads 1093b are not connected to one another, and hence the terminals 1054 overlying those contact pads remain isolated from one another. As in the embodiments discussed above, the traces within the circuit panel also include portions (not shown) which connect the contact pads, and hence the stacked assembly, to other elements of an electronic circuit.

In a variant of this approach, the sheet unit may include some interconnections between terminals, whereas other interconnections between terminals can be provided by traces interconnecting contact pads on the circuit panel. For example, the interconnecting traces within the package (on the core panel of the sheet unit) may extend principally or only in a first direction, whereas interconnecting traces on the circuit panel may extend principally or only in a second direction. Required connections between first and second direction traces are made through the bonds between terminals and contact pads. This arrangement avoids the need for crossing traces in the sheet unit, and also avoids the need for crossing traces in the circuit panel. It can be used, for example, where both the sheet unit and the circuit panel include only a single layer of conductive features.

Figure 20:
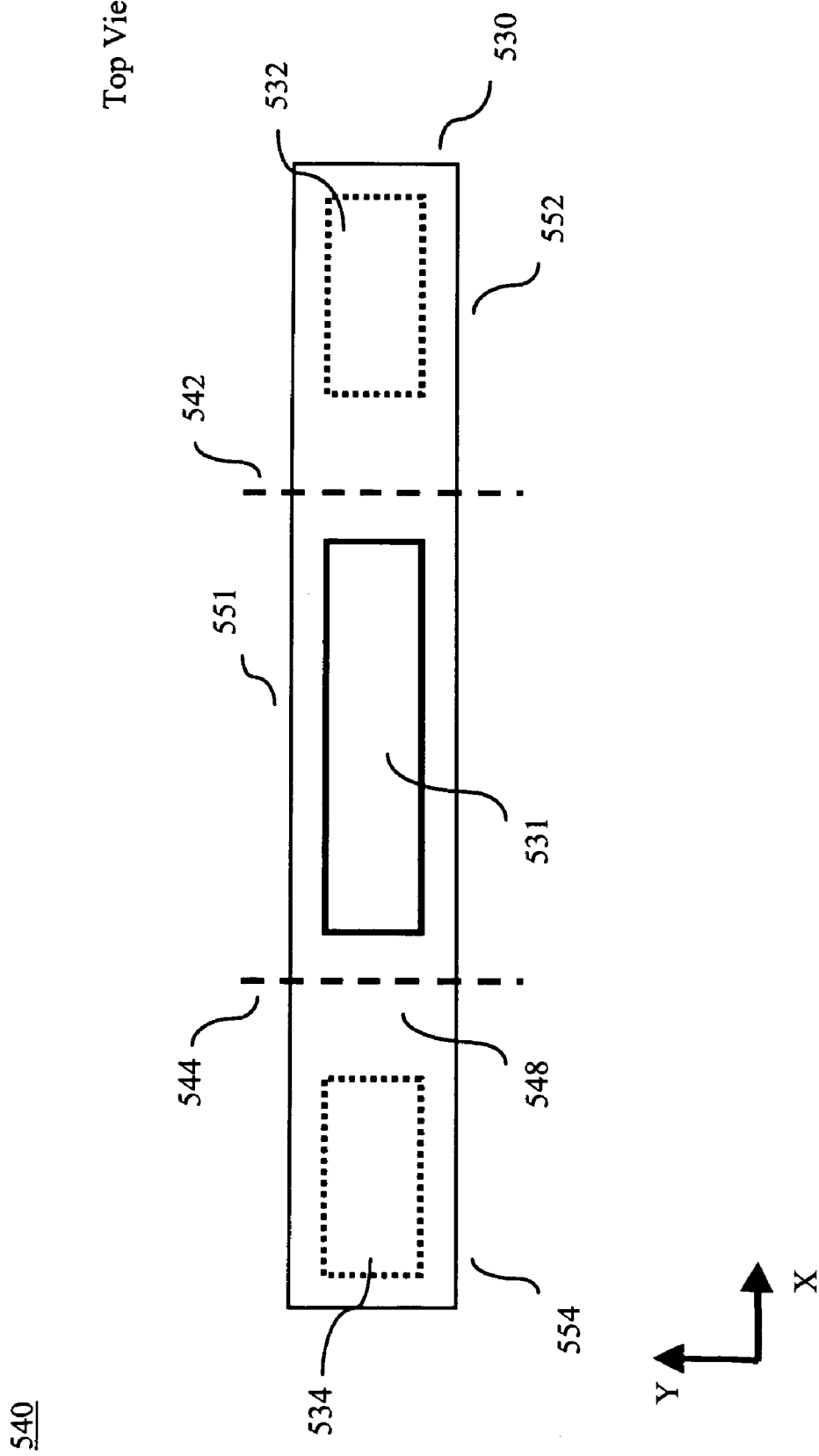
FIG. 20 is a diagrammatic plan view of another embodiment of the present invention.

Turning now to FIG. 20, a diagrammatic plan view of another embodiment in accordance with the principles of the invention is shown. Microelectronic assembly 540 comprises unitary sheet 530, which includes a core panel 551, a side panel 552 and another side panel 554. Microelectronic elements 531, 532 and 534 are mounted on core panel 551, side panel 552 and side panel 554, respectively. Like the earlier-described embodiments, assembly 540 may include unique connections and/or common connections (not shown) to, and between, the microelectronic elements 531, 534, and 532. Similarly, although not shown for simplicity, solder mask layers, compliant layers, encapsulants, and adhesives may be used in the folded stack arrangement of FIG. 20. Finally, dimensions are greatly exaggerated for clarity of illustration.

Sheet 530 is of generally rectangular shape. Microelectronic component 531 is mounted on the obverse side 548 of core panel 551, while microelectronic components 532 and 524 are mounted on the reverse side (as indicated by the dotted lines) of side panels 552 and 554, respectively. Lines 544 and 542 represent two edges of core panel 551. In similar fashion to the embodiments described above, there is a fold line (not shown) and a fold region (not shown) adjacent to each of these edges of core panel 551. In this example, the fold regions are each approximately of the same size.

As can be observed from FIG. 20, the length (in the X direction indicated in FIG. 20) of each microelectronic element 532 and 534 is less than the length of microelectronic element 531. However, the total length of both microelectronic elements 532 and 534 taken together may be approximately equal to, or greater than, the length of microelectronic element 531.

Figure 21:
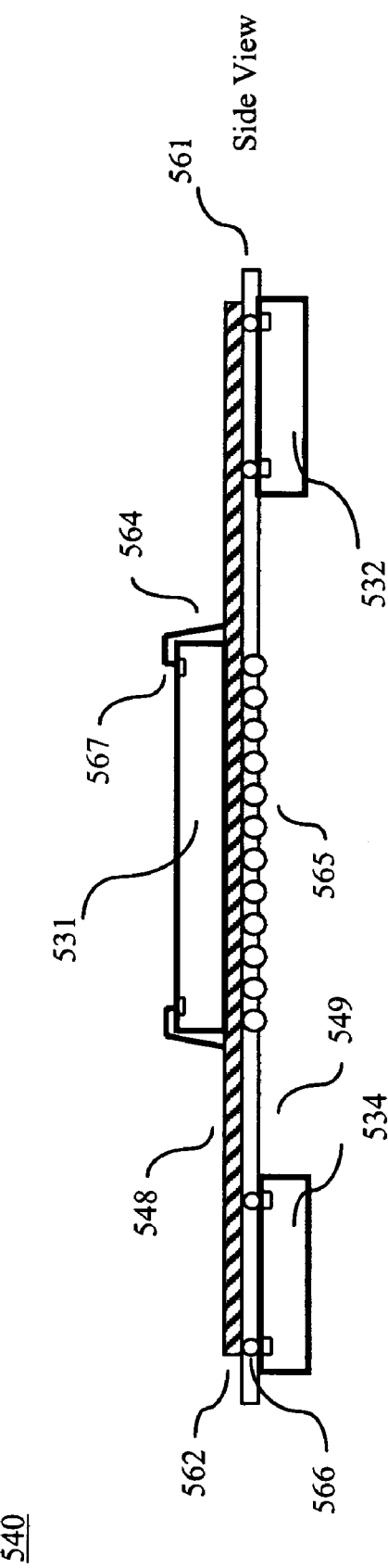
FIGS. 21–22 are illustrative side views of the embodiment of FIG. 20.

Turning now to FIG. 21, a side view of unitary sheet 530 before folding is shown. Unitary sheet 530 includes a layer of a dielectric 561 with metallization layer disposed on the obverse side 548 as represented by metallization layer 562. As before, the metallization layer defines terminals, traces and vias (all not shown) for electrical coupling of the microelectronic elements and of the folded stack assembly. Illustratively, in this example, microelectronic elements 534 and 532 are "flip-chip" bonded to the reverse side 549 of unitary sheet 530 such that their front, or contact-bearing face, faces toward the reverse side 549. The contact-bearing sides of microelectronic elements 532 and 534 are bonded to bond sites on the dielectric 561 (not shown) by conductive bonding materials such as small solder balls 566 arranged in openings (not shown) of dielectric 561 for coupling to metallization layer 562. Microelectronic element 531 is mounted to the obverse side 548 of core panel 551 with its front or contact-bearing face facing upwardly, away from sheet 530. Contacts 567 are connected by wire bonds 564 to the bond pads (not shown) of core panel 551. When folded, the resulting stack assembly is mounted to a circuit panel, such as a printed circuit board, via bonding materials such as small solder balls 565 arranged in openings (not shown) of dielectric 561 for coupling to metallization layer 562.

Figure 22:
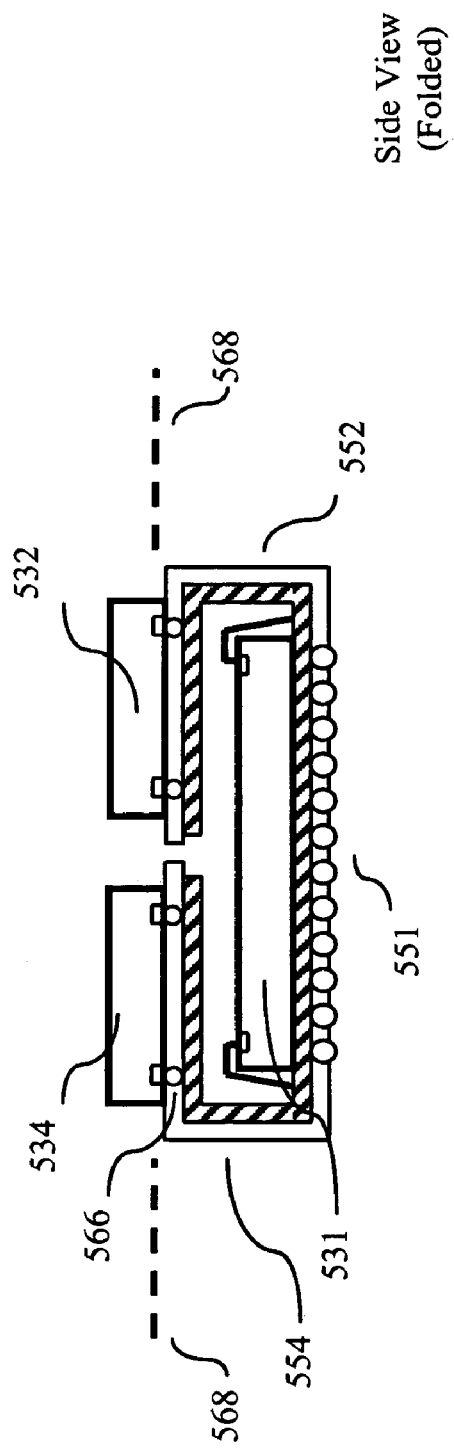

FIG. 22 illustrates unitary sheet 530 after folding of the two side panels. As shown in FIG. 22, side panels 552 and 554 are folded upwards and over the top of microelectronic device 531. The length of each side panel and arrangement of the microelectronic device thereon, are such that, after folding, the respective microelectronic device is arranged vertically over a portion of core panel 551. In addition, each microelectronic device mounted on side panels 552 and 554 are now substantially in the same, or common, geometrical plane as represented by dashed line 568 of FIG. 22. This geometrical plane is substantially parallel to the core panel 551. In other words, at least two of the side panels, when folded, are on the same side of the core panel and substantially the same distance away from a surface of the core panel. As such, after folding, a side face of microelectronic device 534, e.g., side face 536, faces a side face of microelectronic device 532, e.g., side face 537. Preferably, the geometrical plane is either horizontal or vertical with respect to a mounting surface of a circuit panel (not shown). However, the geometrical plane can be of any orientation to the circuit panel.

Put differently, the folded stack arrangement can be viewed as creating a common array of elements that, although on separate folds, are disposed substantially the same distance away from the core panel. In this example, the common array of elements comprises microelectronic devices 532 and 534, which can either be the same type of device or different types of devices. Alternatively, the common array of elements is represented by the terminals (not shown) on the side folds, whether or not a device is present. Finally, the folded stack arrangement could also be viewed as creating a common array of side panels that, after folding, are disposed substantially the same distance away from the core panel.

The arrangement illustrated in FIG. 22 provides low overall height for a stacked assembly and also provides simplified routing of traces connecting microelectronic components thereof between the core panel and each side panel. For example, microelectronic element 531 on the core panel may be a processor, or main chip, and microelectronic elements 532 and 534 on the side panels may comprise memories. As such, the routing of common and/or unique signal paths representing control and addresses from the core panel to each of the side panels is simplified. In addition, since the side folds are smaller (e.g., than the embodiment shown in FIG. 1), it is possible to better control the electrical lengths of the traces to each side fold should impedance and time delay be of concern.

Figure 23:
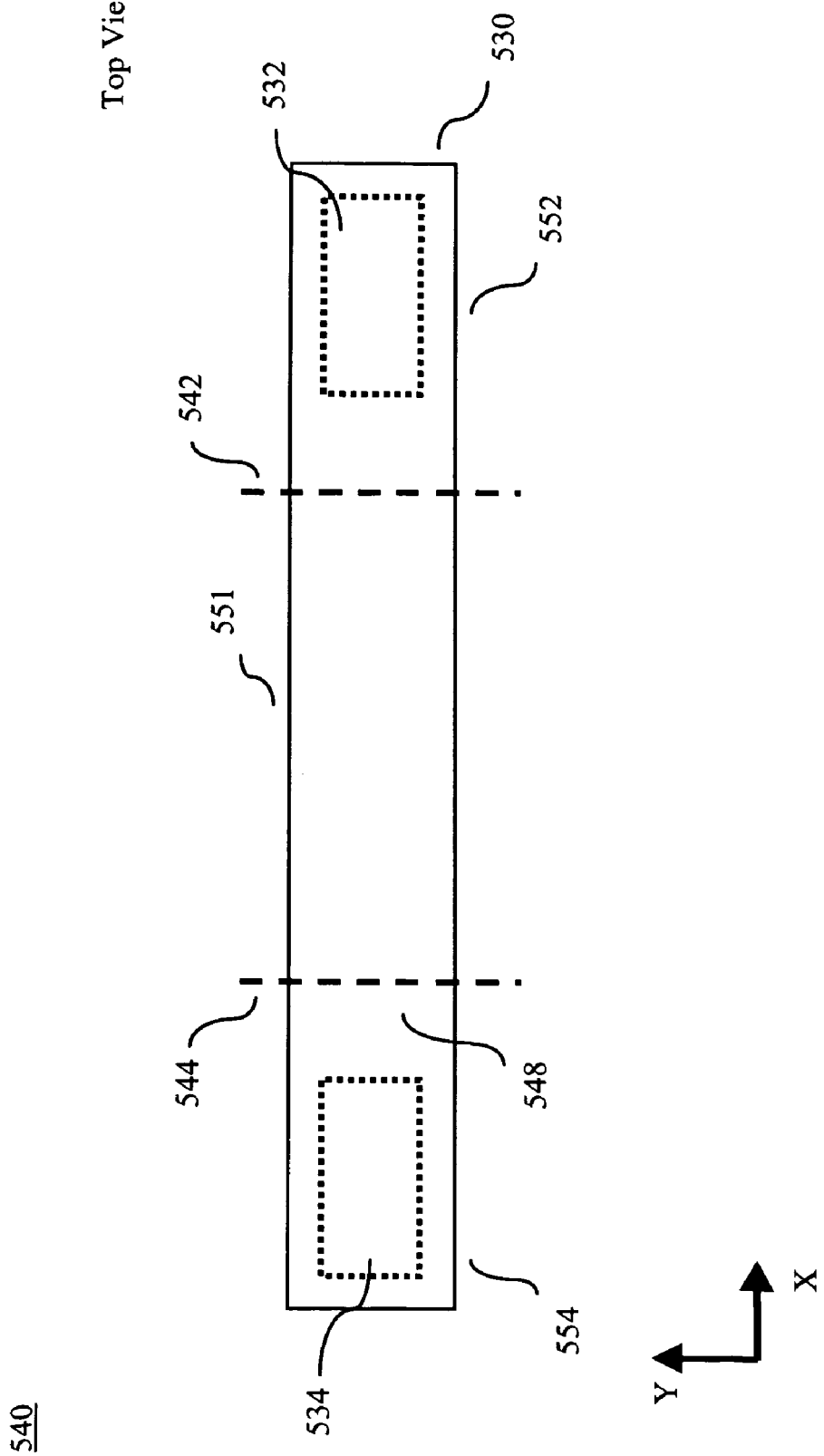
FIGS. 23–24 illustrate diagrammatic plan views of other embodiments of the invention.
Figure 24:
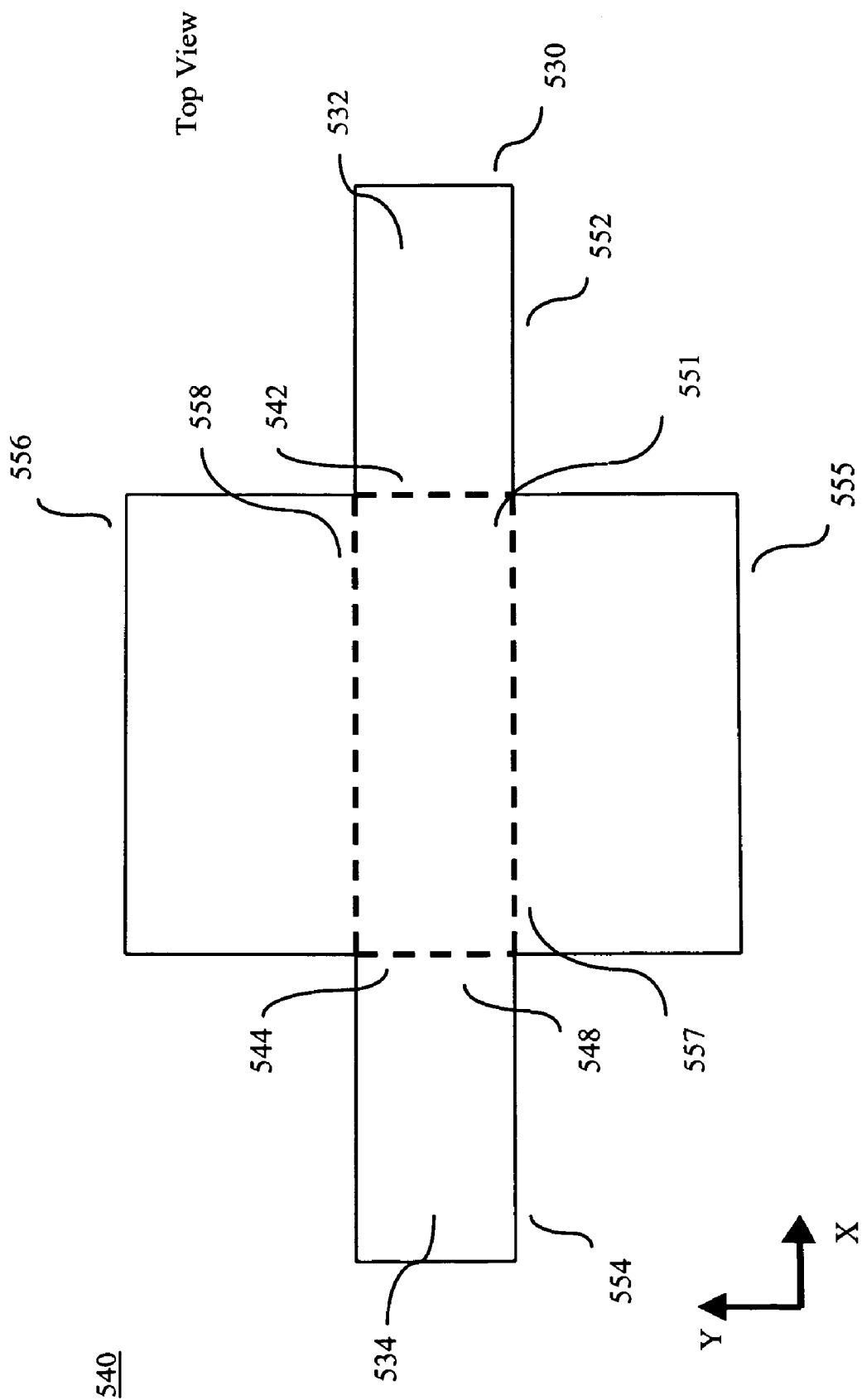

Further alternatives to the embodiment shown in FIGS. 20–22 are possible. For example, consider the illustrative embodiment of FIG. 23, in which there is no microelectronic element mounted on the core panel 551. After folding, a common array of side panels is created, wherein the common array of side panels comprises side panels 552 and 554. Similarly, consider the illustrative embodiment of FIG. 24, which is similar to the cruciform shape shown in FIG. 1, etc., except that after folding, side panels 552 and 554 are arranged to be substantially in the same plane and vertically aligned over a portion of core panel 551, while side panels 555 and 556, adjacent edges 557 and 558, respectively, are folded as described earlier, so be substantially aligned in a stack (horizontally and vertically) over core panel 551. In this latter example, although microelectronic elements were not shown in FIG. 24, they can be arranged on the top or bottom of side panels 555 and 556 as described earlier. In fact, as noted above, each side panel can include a plurality of devices.

Although the embodiments of FIGS. 20–24 were described above with respect to a single layer unitary sheet (i.e., one metallization layers), the inventive concept is also applicable to a multi-layer unitary sheet (i.e., having two or more metallization layers). Similarly, the metallization layer can be formed from a continuous layer or from selective plating, etc., as described earlier. Further, the microelectronic elements can be mounted to the reverse side with their contact-bearing faces facing away from the reverse side. Similarly, the microelectronic element on the obverse side can be mounted such that its contact-bearing face is facing the obverse side. In addition, more than one microelectronic element may be mounted on a panel. Also, although the unitary sheet was illustrated in the context of a rectangular or cruciform shape, other shapes can be used as illustrated earlier, e.g., by FIGS. 12–17. In addition, discrete components (e.g., resistors, capacitors, etc.) may be mounted on a panel in place of, or in conjunction with, a microelectronic device.

It should be noted that it is further possible to introduce features to a chip assembly to control folding by, e.g., a molding process, as described in the co-pending, and commonly assigned, U.S. Provisional Patent Application Ser. No. 60/403,939, filed Aug. 16, 2002 and entitled "Microelectronic Packages With Self-Aligning Features," which is hereby incorporated by reference.

Figure 25:
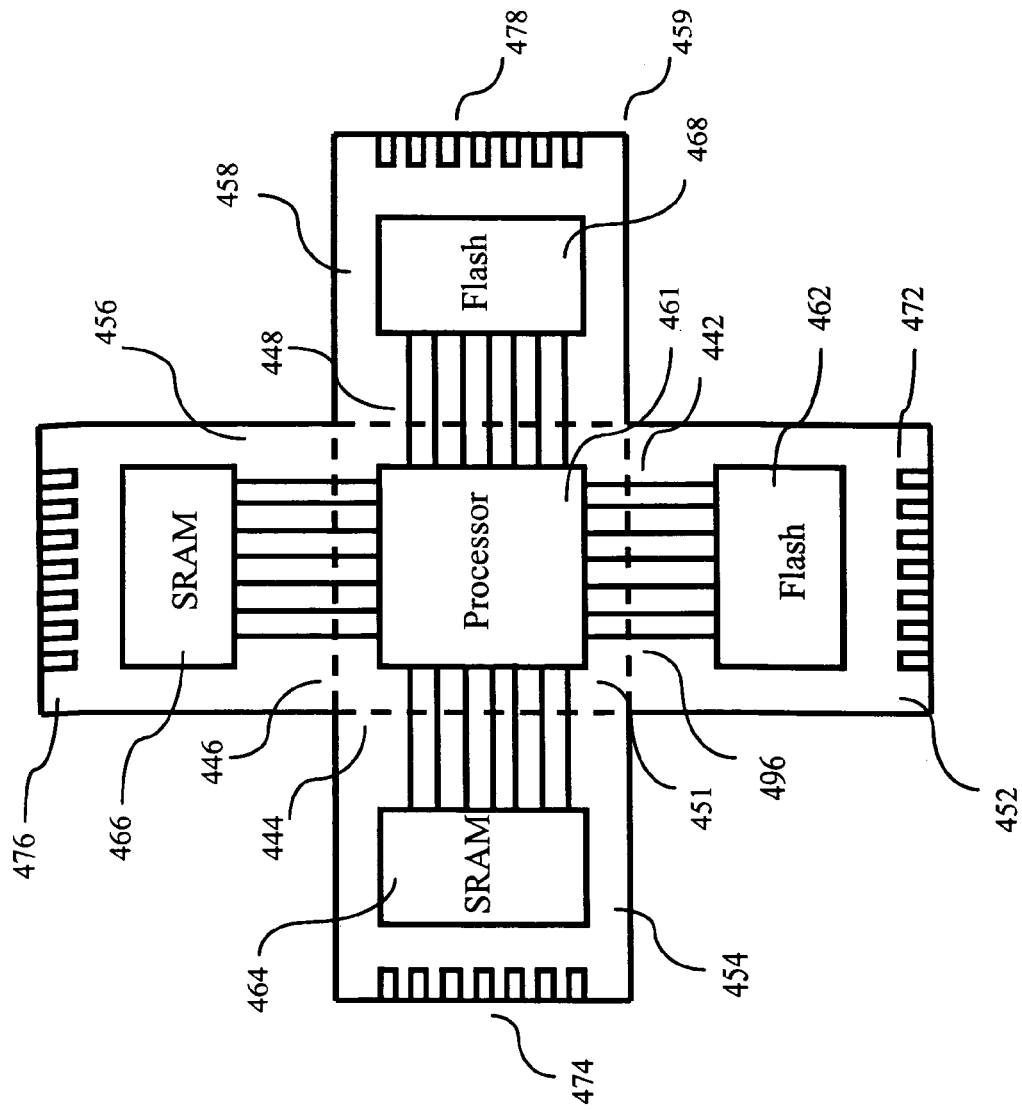
FIG. 25 is a diagrammatic plan view of another embodiment of the present invention.

As noted above, and in accordance with another aspect of the invention, it is possible to increase the yield from a manufacturing, or burn-in, test of chip assemblies. In particular, while portable devices may have differing processor and memory requirements—these requirements may overlap or be subsets of one another. For example, consider the embodiment of a chip assembly 450 (before folding) illustrated in FIG. 25. Chip assembly 450 is similar to the embodiment described above with respect to FIG. 8. In particular, chip assembly 450 comprises a unitary sheet 459 further comprising a core panel 451 and side panels 452, 454, 456 and 458. Edges 442, 444, 446 and 448 separate the side panels from the core panel. A processor 461 is mounted to core panel 451, while SRAM memories 464 and 466, are mounted to side panels 454 and 456, respectively; and flash memories 462 and 468 are mounted to side panels 452 and 458, respectively. These microelectronic devices are electrically coupled via signal paths, or traces, as illustrated by signal path 496. Also illustrated in FIG. 25 are connecting finger pad portions 472, 476, 478 and 480 for electrically coupling, e.g., during testing, to the respective microelectronic element on the respective side panel. Coupling to processor 461 occurs via terminals (not shown) of core panel 451. As noted earlier (e.g., see the discussion associated with FIG. 2), the metallization layer defines terminals and traces (as represented by trace 496) for electrically coupling to the chip assembly and also for coupling to, and between, the devices/components situated thereon. The use of connecting finger pads on the side panels are not required. For example, like core panel 451, metallization layers (not shown) may additionally comprise terminals (test points) on the side panels for engaging a probe assembly for testing the microelectronic elements on the side panels.

For the purposes of this example, it is assumed that each flash memory has a capacity of 16 Mbytes and each SRAM memory has a capacity of 2 Mbytes. Consequently, the maximum memory capacity of chip assembly 450 is 32 Mbytes of flash memory and 2 Mbytes of SRAM memory. However, should one or more of the microelectronic elements on the side panels fail during test—chip assemblies with different memory capacities may result—all of which may be usable in other types of electronic devices (e.g., portable devices such as a PDA or cellular phone) or electronic equipment (a desk top computer). Illustratively, different types of chip assemblies are shown in the Table in FIG. 26.

As can be observed from the table of FIG. 26, if all the memories on the side panels pass the testing process, chip assembly 450 has a memory capacity of 32 Mbytes of flash memory and 2 Mbytes of SRAM memory. However, should one of the flash memories fail, e.g., flash memory 462 mounted on side panel 452, then the chip assembly that results—chip assembly 450-1—has a different memory capacity as shown in FIG. 26, namely, 16 Mbytes of flash memory and 2 Mbytes of SRAM memory. In a similar fashion, other combinations of failures result in differing capacities as shown in the table of FIG. 26. It is assumed for this example that chip assemblies in which there is zero flash memory (e.g., flash memories 462 and 468 both fail), or zero SRAM memory are not usable (although this may not necessarily be the case).

Figure 27:
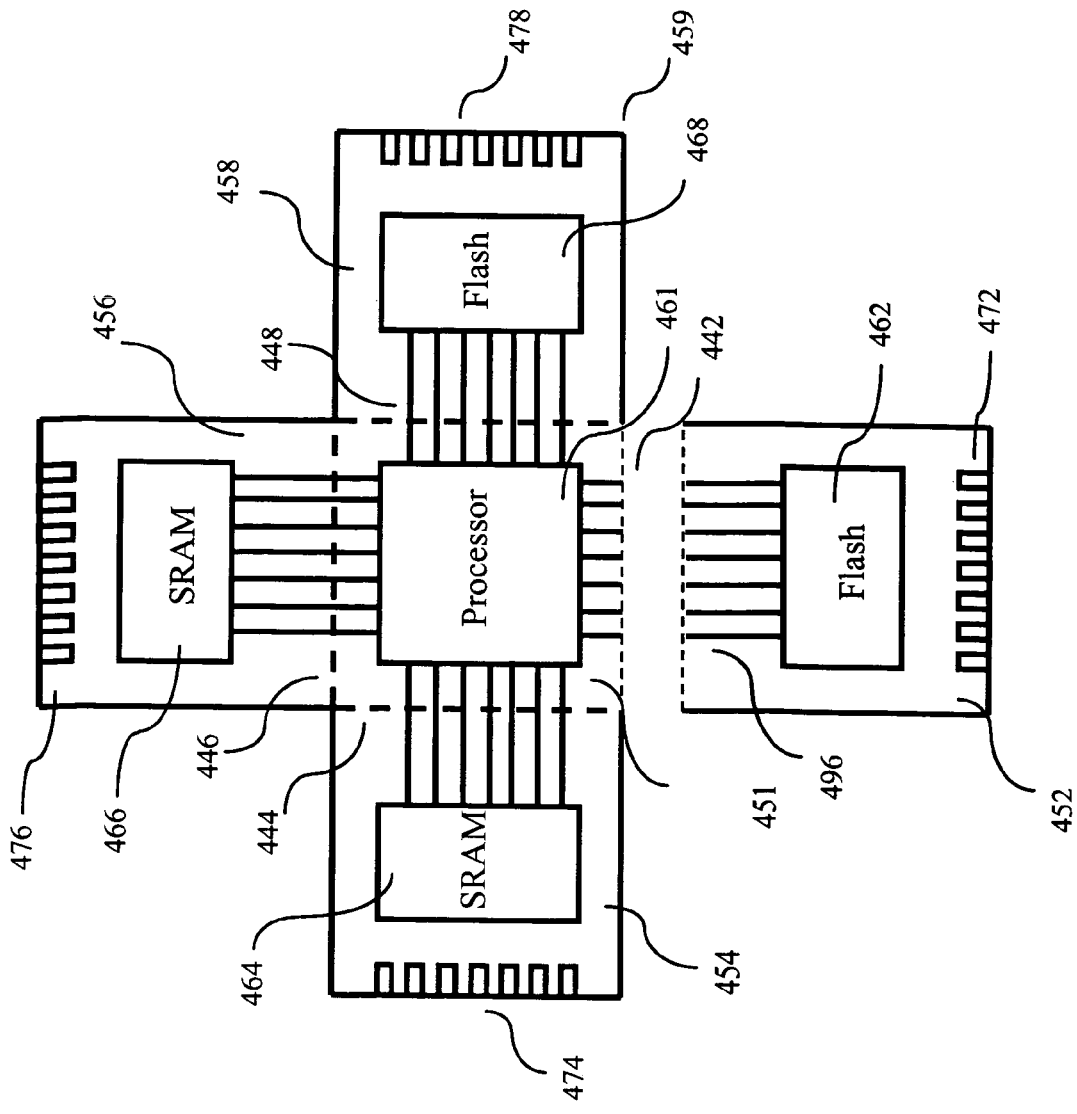
FIGS. 27 and 28 show diagrammatic plan views of other embodiments of the present invention in the context of manufacturing stacked assemblies.

Turning to FIG. 27, an illustration is provided in the case of a failure of one of the microelectronic devices on one of the side panels, here, flash memory 462. In this instance, side panel 452 is simply cut off at edge 442, resulting in a unitary sheet comprising core panel 451 and side panels 454, 456 and 458. This resulting unitary sheet is then folded, as described above, to provide a folded stack arrangement comprising a processor and a memory capacity of 16 Mbytes of flash memory and 2 Mbytes of SRAM memory. Side panel 452 may be cut off in any number of ways, e.g., via scissors, knife-edge, laser, etc.

Figure 28:
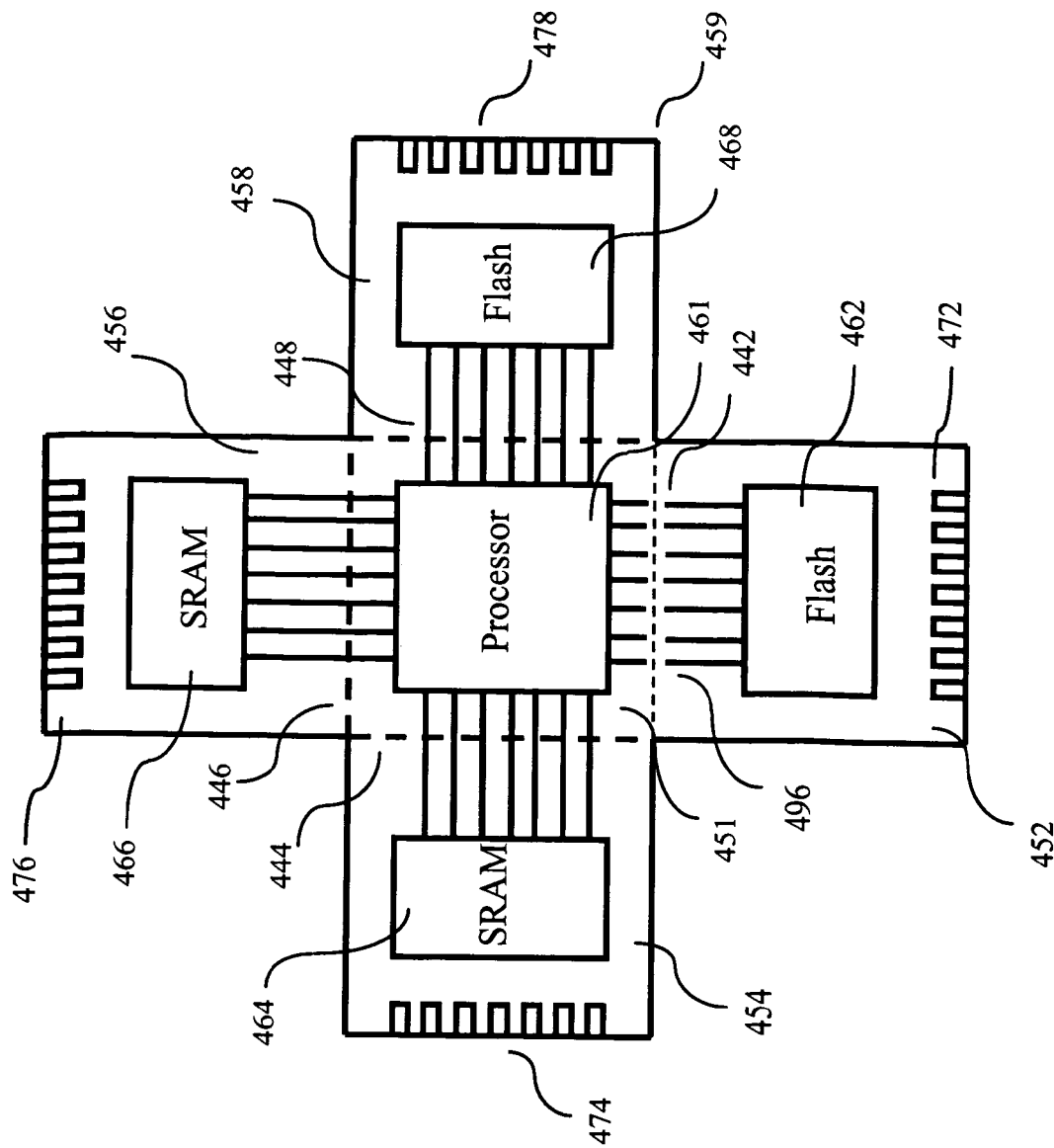

Turning to FIG. 28, another illustration is provided in the case of a failure of one of the microelectronic devices on one of the side panels, here again, flash memory 462. In this instance, side panel 452 is not cut off at edge 442. However, the signals paths, or traces, coupling flash memory 462 to the remainder of the chip assembly are broken as illustrated by trace 496 of FIG. 28. These signal paths can be broken in any number of ways, e.g., by cutting away of the trace, etc. As a result, flash memory 462 is electrically isolated from the remainder of the chip assembly—yet the stacked chip assembly results from the folding of all of the side panels of the unitary sheet, as described above, to provide a folded stack arrangement comprising a processor and a memory capacity of 16 Mbytes of flash memory and 2 Mbytes of SRAM memory.

In accordance with an aspect of the invention, a folded stack assembly has an associated capacity or functionality. The capacity, or functionality, can relate to memory size, processor speed, etc. During manufacture of the folded stack assembly, those side panels associated with failed microelectronic components are disabled. For example the side panel is physically cut-off or the electrical device mounted on the side panel is electrically disconnected from the remainder of the chip assembly. Thus, notwithstanding the failure, a usable stacked microelectronic assembly—albeit of reduced functionality, or capacity—is still produced without requiring removal/replacement or re-testing of the failed microelectronic elements.

As such, in accordance with the above-described ability to increase the manufacturing yield of folded stacked assemblies, a illustrative flow chart of a method of making stacked electronic assemblies of the types described herein using a substrate in the form of a flat sheet is shown in FIG. 28. It is assumed that the sheet comprises a core panel having edges and a plurality of side panels projecting from the edges of the core panel. The geometrical shape of the sheet can be rectangular, cruciform, etc., as shown and described above (e.g., see FIGS. 1, 4, 8, 10, 20, 23 and 24). The sheet further comprises electrically conductive terminals accessible at one of the surfaces of the sheet, and a wiring layer comprising traces extending along the sheet from the core panel to the side panels and being electrically connected to the terminals. In step 831, a substrate in the form of a flat sheet as described herein is provided. In step 832, a plurality of microelectronic elements are mounted to the panels and electrically connected to traces on the panels. In step 833, testing of the microelectronic elements is performed. If one or more microprocessors are mounted on the substrate, it is recommended that these components be tested first since they are typically the most expensive and lower yield components compared to, e.g., a memory.

In step 834, a check is made if any failures were detected. If no failures were detected, the sheet is folded in step 838, thus manufacturing a folded stack assembly. However, if a failure was detected, a check is made in step 835 if it is possible—notwithstanding the failure—to manufacture a folded stack albeit of reduced functionality and/or capacity. For example, a table, such as that shown in FIG. 26 is consulted to check if the resulting functionality and/or capacity is usable. If it is not possible to produce a folded stack of reduced functionality and/or capacity, then the sheet is rejected in step 836. In this situation either further re-work can be performed, e.g., replacement of the failed microelectronic elements, or the sheet can be scrapped. However, if it is possible to produce a folded stack of reduced functionality and/or capacity, then the side panels holding the failed microelectronic elements are disabled in step 837. As described above, the affected side panels can be physically cut-off or the failed microelectronic elements can be electrically disconnected from the remainder of the chip assembly. The remaining side panels are folded in step 838 to provide a folded stack assembly, albeit of reduced capacity and/or functionality.

The topology of the unitary sheet is such that it is possible to disable failed microelectronic elements on particular side panels without affecting devices on other side panels. Illustrative topologies are shown in FIGS. 1, 4, 8, 10, 20, 23 and 24. It should be noted that the inventive concept is not limited to these topologies and is applicable to any topology that allows a side panel, or device(s) thereon, to be disabled—yet still produce an operational folded stack assembly. In contrast, consider a serpentine folded stack. If a device in the middle of the serpentine folded stack fails—it is not possible to physically cut this portion out without affecting the devices beyond this point and it may not be possible to electrically disconnect the failed device without adversely affecting the signal paths to other devices.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A stacked microelectronic assembly comprising:
   a continuous sheet having oppositely-directed obverse and reverse surfaces, the sheet including a core panel having edges, the sheet further including at least two side panels, each of the side panels having a folded portion connecting that side panel to the core panel along one of the edges so that when folded to form a stack with the core panel the at least two side panels are substantially aligned in a plane substantially parallel to the core panel;
   microelectronic elements mounted on at least two of the panels;
   terminals on the core panel, said terminals being movable with respect to the microelectronic elements mounted on the panels; and
   one or more wiring layers including traces extending along the sheet between the panels by way of the folded portions, at least some of the traces connecting the microelectronic elements to at least some of the terminals.

2. An assembly as claimed in claim 1, wherein the core panel is disposed at the top or bottom of the stack, the terminals are disposed on the core panel and exposed for connection to an external circuit, the microelectronic elements including at least two microelectronic elements, each mounted on the at least two side panels.

3. An assembly as claimed in claim 2, wherein the traces connecting a first one of the microelectronic elements mounted on a first one of the side panels to the terminals on the core panel are of substantially equal length to traces connecting a second one of the microelectronic elements mounted on a second one of the side panels to the terminals on the core panel.

4. An assembly as claimed in claim 3, wherein the first and second microelectronic elements are substantially identical to one another.

5. An assembly as claimed in claim 4, wherein the first and second microelectronic elements are memory chips.

6. An assembly as claimed in claim 5, wherein each memory chip includes at least one chip select contact and a plurality of common contacts, and wherein the terminals include a plurality of common terminals and a plurality of chip select terminals, the traces including chip select traces connecting each of the chip select terminals to a chip select contact of only one of the chips and common traces connecting each the common terminal to common contacts of the first and second chips.

7. An assembly as claimed in claim 6, wherein the folded portions of the sheet and at least those portions of the traces extending along the folded portions are flexible.

8. An assembly as claimed in claim 2, wherein the core panel is generally rectangular and the edges include first and second edges, the at least two side panels including first and second side panels connected to the first and second edges, respectively, of the core panel, and wherein the microelectronic elements include first and second microelectronic elements mounted on the first and second side panels, respectively.

9. An assembly as claimed in claim 8, wherein the first and second edges are opposite each other.

10. An assembly as claimed in claim 8, wherein the traces include first and second sets of traces connecting the first and second microelectronic elements, respectively, to the terminals and wherein the traces of each set have substantially the same length as traces in every other one of the sets.

11. An assembly as claimed in claim 1, wherein the terminals are disposed on the core panel and the microelectronic elements include a core panel chip mounted to the core panel and connected to at least some of the terminals and at least two side panel chips mounted on the side panels and connected to the core panel chip through the traces.

12. An assembly as claimed in claim 11, wherein a compliant layer is provided between the core panel and the core panel chip.

13. An assembly as claimed in claim 11, wherein the side panel chips are memory chips.

14. An assembly as claimed in claim 1, wherein the at least two side panels are disposed at the top or bottom of the stack, the terminals are disposed on the side panels and exposed for connection to an external circuit.

15. A stacked microelectronic assembly comprising:
a continuous sheet having oppositely-directed obverse and reverse surfaces, the sheet including a core panel having edges, the sheet further including at least two side panels, each of the side panels having a folded portion connecting that side panel to the core panel along one of the edges;
a first microelectronic element mounted on a first one of the at least two of the panels;
a second microelectronic element mounted on a second one of the at least two of the panels;
a third microelectronic element mounted on the core panel, said first microelectronic element and said second microelectronic element being positioned on a common plane, said common plane being parallel to and remote from said core panel;
terminals on the sheet; and
one or more wiring layers including traces extending along the sheet between the panels by way of the folded portions, at least some of the traces connecting the microelectronic elements to at least some of the terminals.

16. An assembly as claimed in claim 15, wherein the first and second microelectronic elements are memories and the third microelectronic element is a processor.

17. An assembly as claimed in claim 15, wherein the at least two side panels include a first side panel connected to the core panel via a first edge and a second side panel connected to the core panel via a second edge such that the first edge and the second edge are opposite each other.

* * * * *